United States Patent [19]

Miwa et al.

[11] Patent Number: 5,580,797
[45] Date of Patent: Dec. 3, 1996

[54] METHOD OF MAKING SOI TRANSISTOR

[75] Inventors: Hiroyuki Miwa; Takayuki Gomi; Katsuyuki Kato, all of Kanagawa, Japan

[73] Assignee: Sony Corporation, Tokyo, Japan

[21] Appl. No.: 245,767

[22] Filed: May 18, 1994

Related U.S. Application Data

[62] Division of Ser. No. 51,765, Apr. 26, 1993, abandoned.

[30] Foreign Application Priority Data

| May 1, 1992 | [JP] | Japan | 4-112714 |
| May 27, 1992 | [JP] | Japan | 4-160263 |
| May 27, 1992 | [JP] | Japan | 4-160264 |
| May 27, 1992 | [JP] | Japan | 4-160265 |
| May 28, 1992 | [JP] | Japan | 4-162306 |

[51] Int. Cl.⁶ .................................. H01L 21/265
[52] U.S. Cl. ................................. 437/32; 437/21
[58] Field of Search ......................... 257/575, 576, 257/350, 513, 514, 557, 559; 437/31, 32, 21, 33, 101

[56] References Cited

U.S. PATENT DOCUMENTS

| 5,019,525 | 5/1991 | Virkus et al. | 437/32 |
| 5,061,645 | 10/1991 | nakazato et al. | 437/33 |
| 5,100,810 | 5/1992 | Yoshimi et al. | 437/21 |
| 5,128,271 | 7/1992 | Bronner et al. | 437/31 |
| 5,204,275 | 4/1993 | Lane | 437/31 |
| 5,298,786 | 3/1994 | Shahidi et al. | 257/559 |
| 5,352,624 | 10/1994 | Miwa et al. | 437/32 |
| 5,374,568 | 12/1994 | Huang et al. | 437/32 |
| 5,424,575 | 6/1995 | Washio et al. | 257/526 |

FOREIGN PATENT DOCUMENTS

| 4348037 | 12/1992 | Japan | 437/32 |

OTHER PUBLICATIONS

M. Hashimoto, A. Ogasaware, M. Shimanoe, A. Nieda, H. Satoh, A. Yagi and T. Matsushita; Low Leakage SOIMOS-FETs Fabricated Using a Wafer Bonding Method; Extended Abstracts of the 21st Conf. on Solid State Devices and Materials, lTokyo, 1989, pp. 89–92.

G. G. Shahidi, D. D. Tang, B. Davari, Y. Taur, P. McFarland, K. Jenkins, D. Danner, Mr. Rodriquez, A. Megdanis, E. Petrilio, and T. H. Ning; A Novel High–Performance Lateral Bipolar on SOI; IBM Research, T. J. Watson Research Center, Yorktown Heights, NY 10598 pp. 26.1.1–26.1.4 (Date Unknown).

A Thin–Base Laterial Bipolar Transistor Fabricated on Bonded SOI; Fujitsu Laboratories Ltd.; 1991; pp. 5–216–5–217.

*Primary Examiner*—George Fourson
*Assistant Examiner*—Brian K. Dutton
*Attorney, Agent, or Firm*—Ronald P. Kananen

[57] ABSTRACT

A lateral bipolar transistor capable of forming a narrow-sized diffusion region, such as a base width, is disclosed. The transistor exhibits no scattering in the direction of the depth of the width of the diffusion region. Emitter resistance is reduced by varying an impurity diffusion source at substantially a uniform concentration in a semiconductor portion and forming a diffusion region by diffusion from the impurity diffusion source. The bipolar transistor has an SOI structure. A method of making such device is also disclosed.

12 Claims, 22 Drawing Sheets

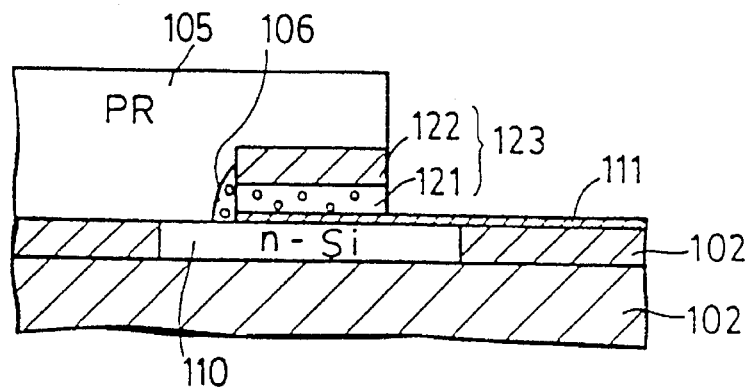
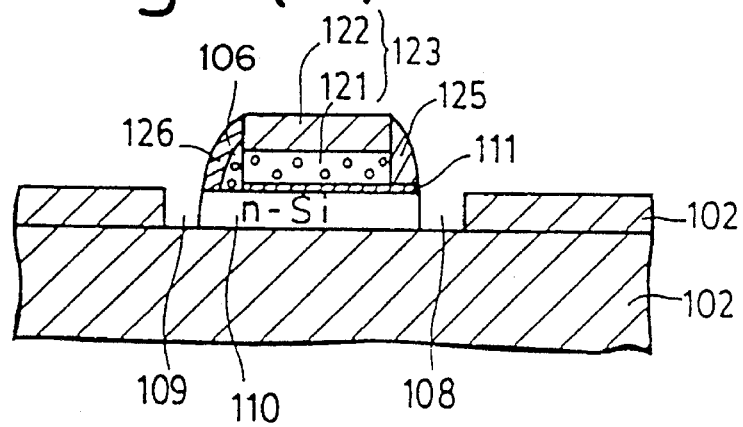
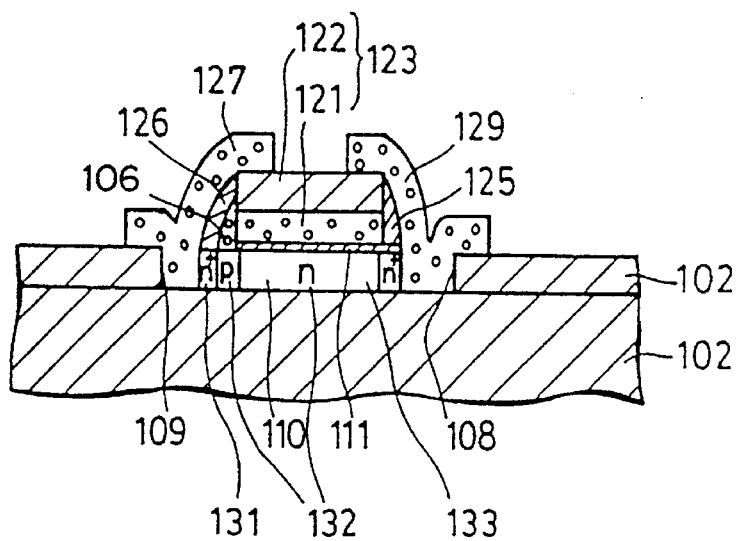

5,580,797

METHOD OF MAKING SOI TRANSISTOR

REFERENCE TO RELATED APPLICATION

This application is a divisional of application Ser. No. 08/051,765, filed Apr. 26, 1993, abandoned.

BACKGROUND OF THE INVENTION

1. Field of the Invention

The present invention concerns a semiconductor device and a method of manufacturing a semiconductor device. The present invention can be utilized, for example, for a lateral bipolar transistor and a method of manufacturing the same. In particular, the present invention can be utilized as a lateral bipolar transistor of an SOI Structure and a method of manufacturing the same.

2. Description of the Prior Art

A bipolar transistor of an SOI structure has been proposed with an aim of reducing junction capacitance Cjs, improvement of α-ray resistance or the like.

On the other hand, as a structure for improving the operation characteristics of a bipolar transistor, a vertical bipolar transistor capable of easily reducing the width of a base has been proposed.

In the vertical bipolar transistor, a buried layer is generally formed in order to reduce parasitic resistance. However, in a case of forming the buried layer, since the area for forming the bipolar transistor is increased, high density integration becomes difficult.

In view of the above, a lateral bipolar transistor of an SOI structure capable of easily reducing the width of a base has been proposed.

There are many proposals for semiconductor devices of the SOI structure and there are also various means for forming them. Any of the means can be used when the present invention is applied to the SOI structure and, as one of such forming methods, a method referred to as a method of forming a bonded SOI structure has been known. Description will now be made for the formation of the SOI structure referring to the above-mentioned method as an example with reference to FIGS. 3(a)–3(d). ("Low Leakage SOIMOS-FETs Fabricated Using a Wafer Bonding Method", M. Hashimoto et. al., Extended Abstracts of the 21st Conference on Solid State Devices and Materials, Tokyo, 1989, pp 89–92).

As shown in FIG. 1(a), a surface on one side of a silicon substrate 1 (a highly flattened silicon wafer is generally used and it is hereinafter referred to as a substrate A) is patterned by using photolithography or etching technology, to form a recess of a depth of 1,500 A or less.

Then, an insulating portion 2 is formed by forming an SiO$_2$ film on the surface by means of CVD or the like. Thus, a structure as shown in FIG. 1(b) in which the insulating portion 2 is formed on one side of the silicon substrate 1 is obtained. The insulating portion 2 is formed as a film having an evenness as shown in the figure conforming the surface shape of the patterned silicon substrate 1.

Further, a poly Si film or the like as a bonded layer 3 is formed to about 5 u thickness on the insulating portion 2 by means of CVD or the like (refer to FIG. 1(c)).

The poly Si film as the bonding layer 3 is disposed for forming a highly smooth bonding surface upon appending another substrate in a subsequent step (substrate 4 shown at B in FIG. 1(e)).

Then, the surface of the bonding layer 3 is flattened by polishing to form a highly smooth surface (FIG. 1(d)). In this case, the bonding layer (polysilicon film) is reduced to a thickness of 3 μm or less as a remaining film.

Another substrate 4 (hereinafter referred to as a substrate B) is closely bonded to the polished surface of the bonding layer 3. Both of the surfaces are joined by the close press bonding to obtain a joined structure as shown in FIG. 1(e). Generally, it is said that a firm joining is attained by hydrogen bonds under the effect of water or hydroxy groups interposed between both of the surfaces. Then, it is usually bonded thermally by heating to attain an extremely firm bonding. The bonding strength is generally greater than 200 kg/cm$^2$ or greater and, depending on the case as great as 2,000 kg/cm$^2$. As another substrate 4 to be bonded (substrate b), a silicon substrate like that the substrate 1 (substrate A) is generally used. Since a heating step is often applied after bonding, disadvantage may possibly be caused unless physical properties such as heat expansion coefficient are equal between them. Without such a problem, for example, in a case of prior art shown in FIGS. 1(a)–1(g) in which another substrate 4 functions merely as a support base, this substrate may not necessarily be a silicon substrate. However, in a case where a device is formed also on another substrate 4 (substrate B) to be bonded, it is required to be a semiconductor substrate capable of forming the device.

Then, the substrate 1 is polished such that the silicon portion of the substrate 1 is reduced to a thickness of about 5 μm or less as the remaining film to obtain a structure as shown in FIG. 1(f). In FIG. 1(f), the vertical relationship is reversed with respect to FIG. 1(e), because the vertical relationship is upturned to put the substrate 1 on the upper side in order for the polishing or the subsequent selective polishing. Then, subsequent polishing is applied. In this case, precision finish polishing is applied till the insulating portion 2 is just exposed. Then, a structure as shown in FIG. 1(g), in which the insulating portion 2 having unevenness is surrounded, and silicon portion 10 is present on the insulating portion is obtained. The silicon portion 10 forms an SOI film. For the structure in which the silicon portion 10 is present on the insulating portion 2 (SOI structure), each of the devices is formed on the silicon portion 10. As shown in FIG. 1(g), since each of the silicon portions 10 is surrounded with the insulating portion 2, a complete device isolation is attained already from the beginning in this constitution.

Description is now made to a process of forming a lateral bipolar transistor while utilizing various kinds of SOI structures to be formed by the method as described above. That is, a lateral bipolar transistor of a known SOI structure will be described below with reference to FIGS. 2(a) and 2(b). FIG. 2(a) is a schematic constitutional plan view, and FIG. 2(b) is a schematic constitutional cross sectional view corresponding to a cross section taken along line III—III in FIG. 2(a). FIG. 2(a) shows an external base electrode 11, an emitter region 13, and a semiconductor portion 30 (a transistor forming region of single crystal silicon).

As shown in FIG. 2(b), a transistor forming region constituted with a semiconductor portion 13 made of single crystal silicon is disposed on an insulating portion (for example, an insulating substrate such as a silicon oxide substrate) 12 as shown in FIG. 2(b).

In the transistor forming region, there are disposed an emitter region 13, a base region 21, a collector region 20, and a high concentration impurity diffusion layer (portion n$^+$ to the left of the figure) for forming a collector contact. The collector region 20 is formed with the transistor forming region.

Further, on the transistor forming region, a base take out electrode 17 connected, by way of a silicon oxide film 22, to the base region 21 is formed as shown in FIG. 2(a) and FIG. 2(b), and the base take out electrode 17 comprises a laminate structure of polysilicon 16, and an oxide silicon film 22 and polysilicon side walls 15, 18 formed on the sides of the laminate structure. Further, side walls 14, 19 of silicon oxide film are formed on the sides of the base take out electrode, and the base take out electrode 17, an emitter take out electrode (not illustrated) and a collector take out electrode (not illustrated) are separated from each other by the side walls 14, 19.

A lateral bipolar transistor is constituted as described above. In FIG. 2(a), reference numeral 11 represents an external base electrode.

Description is now made to a method of manufacturing the lateral bipolar transistor described above by way of a manufacturing step chart shown in FIGS. 3(a)–3(d).

As shown in FIG. 3(a), a thin film semiconductor portion 50 made of single crystal silicon is formed on an insulating portion 32 (for example, an insulating substrate which is a silicon oxide substrate) is formed. This can be formed by the SOI structure described previously. The thin film semiconductor portion 50 is introduced with N-impurity.

Subsequently, a silicon oxide film 44 and p+ poly Si 45 are formed by chemical vapor phase deposition method.

Then, as shown in FIG. 3(b), a laminate film of p+ poly Si 45 and the silicon oxide film 44 shown in FIG. 3(a) are fabricated, respectively into poly Si 37 and silicon oxide 31. The fabrication width in this case corresponds to a collector length.

As shown in FIG. 3(c), poly Si side walls 38, 41 are formed on the side walls on the side of the emitter by chemical vapor phase deposition and by subsequent anisotropic etching. The side walls 38, 41 function as a base contact.

Then, after covering the side of the emitter with a resist, $N^+$ ions are implanted over the entire surface. This forms a high concentration impurity diffusion region for forming the collector contact.

Successively, silicon oxide side walls 46, 47 are formed on the side walls of the laminate film of the p+ poly Si 37 and the silicon oxide film 31 by chemical vapor phase deposition and subsequent anisotropic etching. Successively, base ions are implanted over the entire surface. FIG. 3(c) shows the cross sectional structure at this instance.

Then, $N^+$ ions are implanted over the entire surface to form an emitter. Successively, silicon oxide side walls 39, 40 of a relatively large thickness are formed on the side walls of the laminate film of the $P^+$ poly Si 37 and the silicon oxide film 31 and then silicidation process is applied. The silicide portion is detected by reference numeral 42. Since the side walls 39, 40 function to apart the suicides 43, 48 from the emitter base junction, the thickness has to be increased by a relatively large amount. Thus, a cross sectional structure as shown in FIG. 3(d) is obtained. As described above, a lateral bipolar transistor is formed.

However, as can be seen from a 2-dimensional impurity profile of similarly constructed transistor 54 shown in FIG. 4, since the base 51 (adjoining p++ poly Si layer and SOI layer 56) and the emitter 53 are formed by side diffusion from above, scattering is caused in the direction of the depth to the width of the base region 51, formed over semiconductor portion 52.

Specifically, the width of the base region 51 is increased as it is away from the surface to bring about an undesirable effect in this portion such as reduction of current amplification $h_{PE}$ or lowering of cut-off frequency $f_T$. This causes scattering of characteristics due to the scattering of the thickness of the SiO silicon film.

Further, in the existent lateral bipolar transistor, since ion implantation is applied by using the side walls 46, 47 of the silicon oxide film as a mask and, subsequently, the base and the emitter are formed by diffusion from above, the width of the base region tends to suffer from the effect of the width of the side walls 46, 47 of the silicon oxide film and it is also regulated by the subsequent heat treatment.

Accordingly, the width of the base region varies depending on the width of the side walls 46, 47 of silicon oxide film and conditions of heat treatment, so that electric characteristics such as current amplification factor $h_{PE}$ or cut-off frequency $f_T$ vary.

In view of the above, it has been desired to provide a lateral bipolar transistor having a narrow size for the width of the base and having a base region with high dimensional accuracy for the width of the base.

Description will now be made to other prior art.

Bipolar transistors of a SOI structure has now been under development with an aim, for example, of improvement to the low parasitic capacitance, latch-up free and a-ray resistance and FIG. 5 shows a cross sectional view of a bipolar transistor of an SOI structure prepared by the existent method.

In a bipolar transistor shown in FIG. 5, an N-type silicon substrate is bonded on a substrate oxidized over the entire surface ($SiO_2$) 81 and, after forming a field oxide film 91 and $SiO_2$ 84 by device isolation, a contact hole is opened on a collector region. Then, after forming poly Si and $SiO_2$ successively over the entire surface of the N-substrate, the poly Si and $SiO_2$ are removed while leaving poly Si 82 and $SiO_2$ 85 on the collector region. Then, after implanting boron over the entire surface of the N-substrate, a SiN side wall 82 is formed. Then, after covering the base take-out region with a resist pattern, arsenic is ion implanted. In this case, P-ions below the SiN side wall 82 are left and P ions in other regions are compensated by $N^+$ ions to form an $N^+$ diffusion layer 89 and a P diffusion layer 87. Then, after patterning the interlayer insulating film 92, aluminum is vapor deposited on the surface of the N-substrate to form an electrode 88. As a result, the $N^+$ diffusion layer 89 forms an emitter region, the P diffusion layer 87 forms a base region and the N-diffusion layer 83 forms a collector region.

However, according to the method shown in FIG. 5, the base region 87 is formed by using the side wall of the SiN 82 for arsenic ions. Accordingly, the width of the base region is controlled by the width of the side wall. However, since the width of the side wall varies and is difficult to be controlled, control for the width of the base is also difficult to bring about a problem.

Further, since the base take-out region is formed in a direction perpendicular to the direction of the width of the base, a base current flows along a long path and the base resistance is increased by so much to bring about a problem.

Further, in the transistor of the SOI structure, latch-up free and reduced parasitic capacitance can be realized by complete insulator separation.

As one of methods for obtaining the SOI substrate, a method of applying ion implantation of oxygen at an order, for example, of $10^{17}$ $cm^{-2}$ (hereinafter sometimes simply referred to as implantation) and subsequent high temperature annealing has been known, because a crystal silicon layer can be formed relatively simply and at a good reproducibility.

More specifically, ion implantation of oxygen is applied, for example, at an order of $10^{17}$ cm$^{-2}$ to a silicon semiconductor substrate 91 shown in FIG. 6(*a*) as schematically shown by reference I shown in FIG. 6(*b*) (ion implanted portion is schematically shown at 94) and then annealing is applied at 1250° in an inert gas atmosphere in a diffusion furnace to obtain an SiO$_2$ film as an insulating film 92 and then crystal silicon film 93 is formed thereover, to obtain a structure shown in FIG. 6(*c*).

In the known technique as described above, annealing in a diffusion furnace at a temperature of about 1,250° C. for several hours is used as a heat treatment after oxygen implantation. The high temperature annealing is applied for sharpening making a dull side slope of an oxygen distribution in implantation abrupt by depositing or out diffusing oxygen from the surface and, further, recovering defects caused by high dose implantation, thereby forming a crystal silicon layer and oxide layer. However, since the annealing is applied at high temperature, defects such as slip lines are liable to be caused to bring about a problem for practical use. In addition, even annealing at about 1250° C. is still insufficient for the recovery of defects caused by implantation at the order of $10^{17}$ cm$^{-2}$. Further, since a high temperature heat treatment is inevitably used for forming the SiO layer in this method, it is difficult to obtain a multi-layered SOI substrate.

OBJECT AND SUMMARY OF THE INVENTION

A first object of the present invention is to provide a semiconductor device that can be constituted as a lateral bipolar transistor having a base region with a narrow size for the base width and a high dimensional accuracy of the base width, as well as a manufacturing method therefor more particularly, a semiconductor device, which suffers from less restriction in view of the manufacturing process and can be obtained by easy steps, as well as a manufacturing method therefor.

A second object of the present invention is to provide a semiconductor device, particularly, a lateral bipolar transistor, capable of forming a diffusion region (base region) with a narrow size for the diffusion region, in particular with regard to base width, and with no scattering in the direction of the depth of the width of the diffusion region (such as a base region), as well as reducing the resistance (emitter resistance) by burying an impurity diffusion source substantially at a uniform concentration in a semiconductor portion and forming a diffusion region by diffusion from the impurity diffusion source.

A third object of the present invention is to provide a semiconductor device having a bipolar transistor of an SOI structure having stable a base width of good controllability and having reduced base resistance and collector resistance, as well as a method of manufacturing the same.

A fourth object of the present invention is to provide a method of manufacturing an SOI substrate without defects such as slip lines which is capable of restoring defects which may possibly be caused upon ion implantation of oxygen at a high concentration and which is capable of forming a multi-layered SOI substrate.

DETAILED DESCRIPTION OF THE PREFERRED EMBODIMENTS

Description will now be made to a first embodiment according to the present invention with reference to the drawings.

In this embodiment, a lateral bipolar transistor of an SOI structure was formed as described below.

Figure 7A:
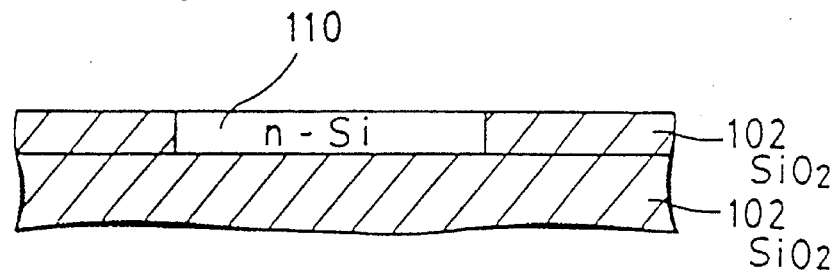
FIG. 7(*a*) through FIG. 7(*f*) illustrate a method of manufacturing an SOI bipolar transistor as a first embodiment according to the present invention and a cross sectional structure thereof.

As shown in FIG. 7(*a*), a thin film layer made of single crystal silicon was formed on an insulating portion 102 as an insulating substrate (for example, silicon oxide substrate), to form a semiconductor portion 110. N-impurity was introduced into the thin film layer semiconductor portion 110. For forming the above-mentioned constitution, existent wafer bonding technique (refer for example, to the description as described above) and selective oxidation technique may be used. Thus, a structure shown in FIG. 7(*a*) is obtained.

Figure 7B:
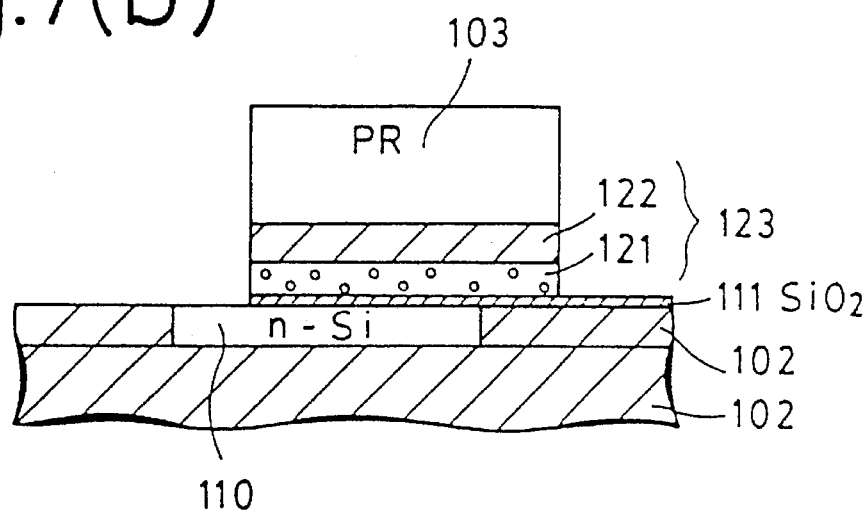

Then, as shown in FIG. 7(b), a laminate 123 comprising a thin oxide film 111 such as $SiO_2$, $p^+$ poly Si as a first conductor 121 and a silicon oxide film as an insulator 122 is formed by means of CVD.

Subsequently, the laminate structure 123 comprising the thin oxide film 111, $P^+$ poly Si and silicon oxide film is fabricated by using a mask 103 such made of a photo-resist. In this case, one end of the laminate structure 123 is formed on the substrate semiconductor portion 110, while the other end thereof is formed on the substrate insulating portion 102. A structure as shown in FIG. 7(b) is thus obtained.

Figure 7C:
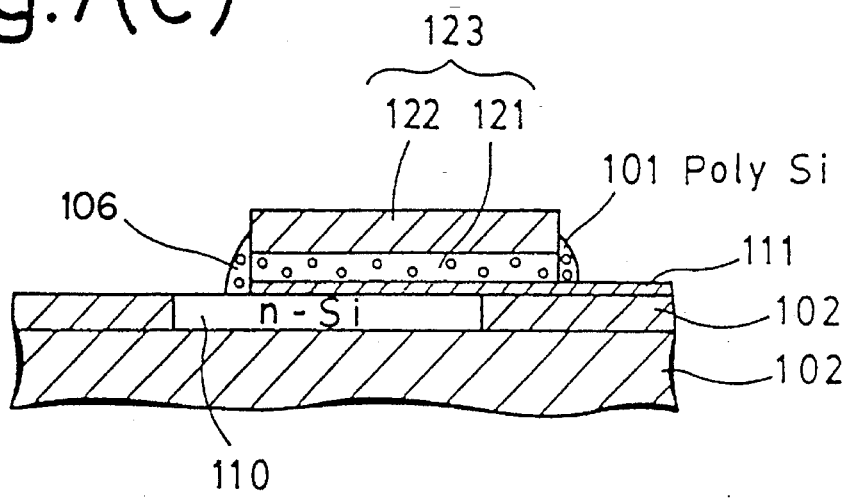

Then, as shown in FIG. 7(c), side walls 101, 106 of a second conductor are formed with poly Si on the side walls of the laminate structure 123. The side wall 124 functions as a base contact.

In this case, since one end of the laminate structure 123 is formed on the substrate insulating portion 102 in the above-mentioned step, the side wall 101 in contact with this portion is not connected with the single crystal silicon thin film semiconductor portion 110. Accordingly, the side wall 124 that functions as the base contact can be connected with the single crystal silicon thin film layer semiconductor portion 110 only at one end of the side wall of the laminate structure 123. A structure shown in FIG. 7(c) is thus obtained.

Then, as shown in FIG. 7(d), a portion of the laminate structure 123 and the poly Si side wall 106 on the substrate semiconductor portion 110 are covered with a protection film 105 such as a resist, and the exposed portion is removed. Thus, a structure in which the poly Si side wall 106 is left so as to be in contact only with a portion of the side wall of the laminate structure 123 and connected with the substrate semiconductor portion 110 is formed as shown in FIG. 7(d).

Then, as shown in FIG. 7(e), insulating side walls 125, 126 of are formed with a silicon oxide film on the side walls of the laminate structure 123 by chemical vapor phase deposition and anisotropic etching subsequent thereto. The side walls 125, 126 function as an isolation film and respectively as a base contact and an emitter contact to be formed later.

Subsequently, the exposed single crystal silicon thin film layer semiconductor portion 110 is removed by etching as far as the underlying substrate insulating portion 102 by using the side walls 125, 126 of the silicon oxide film as a mask. Thus, a structure as shown in FIG. 7(e) is obtained. Recesses formed upon removal by etching are shown by references 109, 108.

Then, as shown in FIG. 7(f), poly Si 127, 129 are buried as a third conductor to the recesses 109, 108 of the single crystal silicon thin layer semiconductor portion 110 formed in the above-mentioned step by chemical phase vapor deposition.

Then, after covering the collector side (right side in the Figure) with a resist, $P^+$ ion implantation is applied over the entire surface. Subsequently, a base 132 is formed along a direction in parallel with the surface layer of the single crystal silicon thin film layer (horizontal direction in the figure) by annealing using the poly Si 127, 129 as a diffusion source.

By the method as described above, the base 132 can be formed from a diffusion source at a substantially constant concentration in the direction of the depth of the single crystal silicon thin film layer semiconductor portion 110 (vertical direction in the figure), so that unevenness impurity concentration in the direction of the thickness of the substrate which causes a problem in the prior art can be overcome.

Further, the impurity diffusion layer is formed by self-alignment with a base contact electrode which is a side wall 106 formed in the above-mentioned step.

Then, after implanting $N^+$ ions over the entire surface and applying annealing, an impurity diffusion region at a high concentration is formed for forming a contact of an emitter 131 and a collector 133 using the poly Si 127, 129 as the diffusion source.

Also in the emitter, the problem in the prior art, that is, the unevenness of the impurity concentration in the direction of the depth of the substrate can be overcome like that in the case of the base as described previously.

Subsequently, poly Si is applied to provide emitter and the collector take out electrodes. Thus, an impurity diffusion layer at high concentration for forming the collector contact is formed.

In the present invention, when the side wall of the second conductor is formed so as to be in contact only with a portion of the side wall of the laminate structure, the side wall 106 of the second conductor is at first formed so as to be formed in contact with the entire surface of the side wall of the laminate structure and, thereafter, unnecessary portion is removed, to attain the object. Accordingly, it can be manufactured by an easy process without requiring etching technique at high selection ratio that has been required so far.

In the invention according to the present application, a diffusion region such as a base region with a narrow size for the width of the diffusion region (base width or the like) and with no scattering in the direction of the depth of the diffusion region can be formed by forming the diffusion region (base, emitter or the like) of a semiconductor device (for example, lateral bipolar transistor) by diffusion from an impurity diffusion source substantially at an uniform concentration buried in the semiconductor portion such as silicon.

Further, by forming the impurity diffusion source substantially at a uniform concentration by self-alignment with the diffusion region take-out electrode (base take-out electrode or the like), it can contribute to the reduction of the device region, improvement of the device characteristic and improvement for the integration degree are enabled.

Further, the base take-out electrode or the like can be formed easily by utilizing the conductor side wall, so that the width of the base contact can be reduced.

That is, according to the present invention, it is possible to provide a technique capable of constituting a lateral bipolar transistor so as to have a base region with a narrowed size for the base width and a high dimensional accuracy for the base width, more specifically, a semiconductor device less suffering from restriction in view of the manufacturing process and capable of obtaining by easy steps, as well as a manufacturing method therefor.

Description will now be made to a second embodiment of the present invention.

In this embodiment, the present invention is applied to an SiO lateral bipolar transistor. Description will now be made with reference to FIG. 8(a) to 8(e).

Figure 8A:
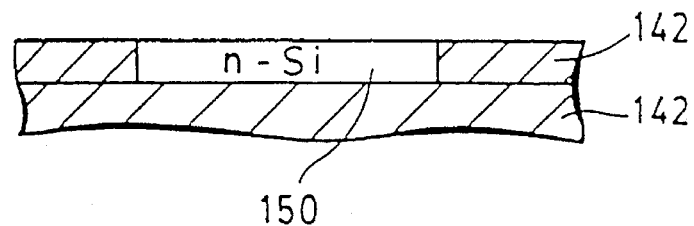
FIG. 8(*a*) through FIG. 8(*e*) illustrate a method of manufacturing an SOI bipolar transistor as a second embodiment according to the present invention and a cross sectional structure thereof.
Figure 8B:
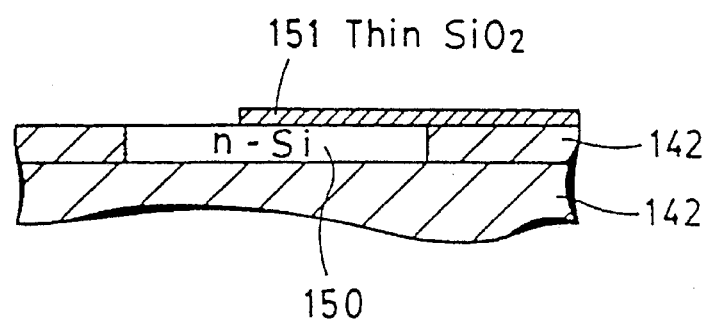

As shown in FIG. 8(a), a thin film layer comprising single crystal silicon is formed on an insulating portion 142 which is an insulating substrate, (for example, silicon oxide substrate), to form a semiconductor portion 150. N-impurity is introduced into the thin film layer semiconductor portion 150. For forming the above-mentioned constitution, the existent wafer bonding technique (for example, refer to the description described above) and selective oxidation technique can be used.

Figure 8C:
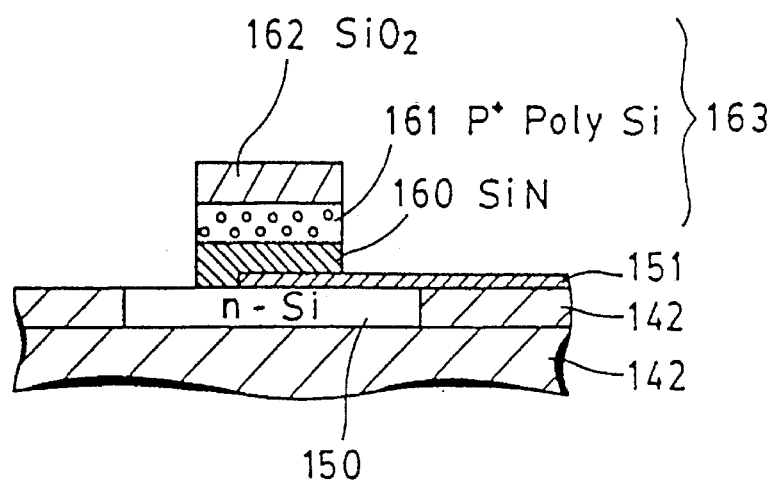

Then, as shown in FIG. 8(c), a thin oxide film 151 such as $SiO_2$ is formed by CVD and the thin oxide film 151 is opened so as to expose a portion of the semiconductor portion 150 as the single crystal silicon thin film layer as shown in the figure.

Then, as shown in FIG. 8(c), a laminate film 163 comprising a silicon nitride film 160, a $P^+$ poly Si 161 as a first conductor and a silicon oxide film 162 as an insulator is formed. Then, the laminate film 163 comprising the silicon nitride film 160, the $P^+$ poly Si 161 and the silicon oxide film 162 is fabricated. In this case, it is fabricated such that one end of the laminate film 163 covers the thin oxide film 161 shown in FIG. 8(b). In addition, since it is also necessary to leave the thin oxide film 151 on the side to be covered, the silicon nitride film 160 is fabricated using, for example, an anisotropic etching technique with $CH_2F_2+CO_2$ gas. This enables etching for the silicon nitride film 160 at a high selection ratio to the oxide film 151. Further, the fabrication width constitutes the collector length.

Figure 8D:
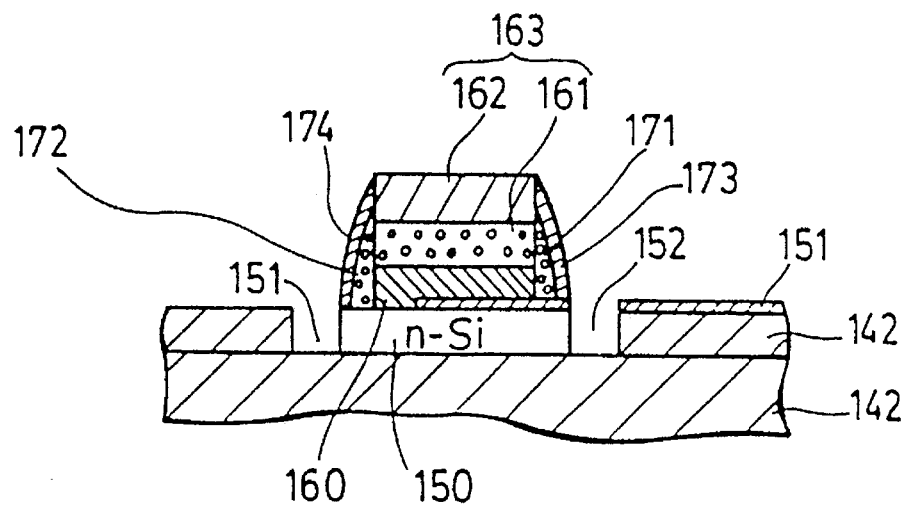

Then, as shown in FIG. 8(d), poly Si side walls 171, 172 are formed successively as a second conductor on the side walls of the laminate film 163 by chemical vapor phase deposition and anisotropic etching subsequent thereto. The side walls 171, 172 function as the base contact. In addition, since the thin oxide film 151 is left at one end of the laminate film 163 as shown in FIG. 8(c), the side wall 171 in this portion is not connected with the semiconductor portion 150 of the single crystal silicon thin film layer. Accordingly, the side wall 172 functioning as the base contact can be connected with the semiconductor portion 150 as the single crystal silicon thin film layer only at one end (left end in the figure of the side wall of the laminate film 163).

Successively, insulator side walls 173, 174 of a silicon oxide film are formed on the side walls of the laminate film 163 by chemical vapor phase deposition and anisotropic etching subsequent thereto. The side walls 173, 174 function as an isolation film to the base contact and an emitter contact formed subsequently.

Then, the exposed semiconductor portion 150 as the single crystal silicon thin film layer is removed by etching as far as the underlying insulating substrate 142 using the side walls of the silicon oxide films 173, 174 as a mask. Recesses formed by removable under etching are shown by reference 151, 152.

Figure 8E:
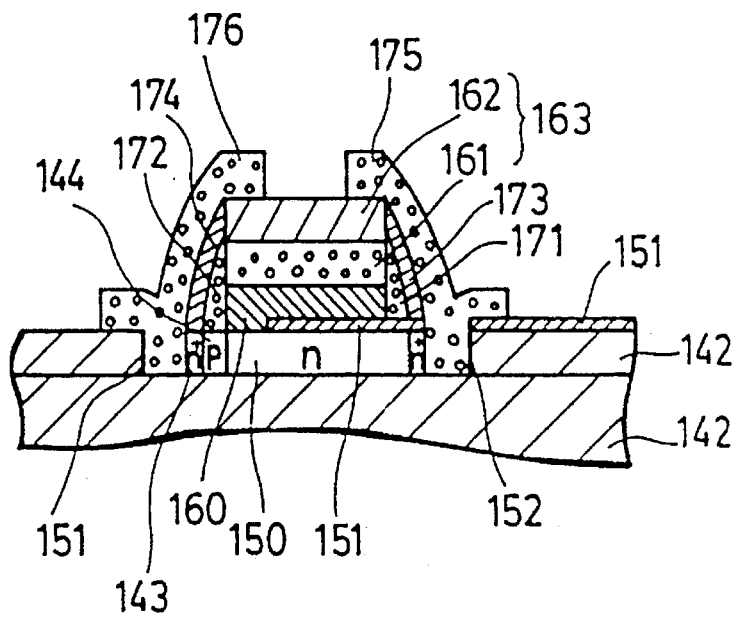

Then, as shown in FIG. 8(e), poly Si 175 and 176 are buried as a third conductor into the recesses 151, 152 of the single crystal silicon thin film layer semiconductor portion 150 in FIG. 8(d).

Then, after covering the collector side (right side in the figure) with a resist, $P^+$ ion implantation is applied over the entire surface. This makes poly Si 176 on one side (left side in the figure) into $P^+$ type. Then, a base 144 is formed by annealing in the direction in parallel with the surface layer of the single crystal silicon thin film layer semiconductor portion 150 (horizontal direction in the figure) using the poly Si 176 as a diffusion source.

This method enables to form the base 144 in the direction of the depth of the single crystal silicon thin film layer semiconductor portion 150 (vertical direction in the figure) from a diffusion source at a substantially constant concentration, which overcomes the problem in the prior art, that is, the unevenness of impurity concentration in the direction of the depth of the substrate. Further, the impurity diffusion source defined by the side wall 172 that functions as a base contact electrode, so that it is formed by self-alignment therewith.

Then, $N^+$ ion implantation is applied over the entire surface and then annealing is applied, thereby forming an impurity diffusion region at a high concentration for forming an emitter and collector contacts using the poly Si 175, 176 as the diffusion source.

Also in the emitter, unevenness of the impurity concentration in direction of the depth of the substrate which is the problem in the prior art can be overcome like that in the case of the base as described previously.

Subsequently, the crystal silicon is fabricated leaving the emitter and collector take-out electrodes. Thus, an impurity diffusion region at a high concentration for forming the collector contact is formed.

As has been described above specifically, according to this embodiment, when the bipolar transistor is formed on the thin film SOI substrate, the base and the emitter as the diffusion regions 143, 144 are formed by diffusion from the impurity diffusion source at a substantially uniform concentration formed with the conductors 175, 174 buried in the silicon semiconductor portion 150 (Si substrate), whereby a base region with a narrow size for the base width and with no scattering in the direction of the depth of the base width can be formed.

Further, by forming the impurity diffusion source substantially at a uniform concentration by self-alignment with the base-take out electrode, it is possible to reduce the device region, contribute to improvement of the device characteristics and to the improvement for the integration degree.

According to the present invention, it is possible to provide a semiconductor device that can be embodied as a lateral bipolar transistor or the like having a base region with a narrow size for the base width and a high dimensional accuracy for the base width, as well as a manufacturing method therefor.

Description will now be made to a third embodiment according to the present invention with reference to the drawings.

In this embodiment, a lateral bipolar transistor of an SOI structure was formed as described below.

Figure 9A:
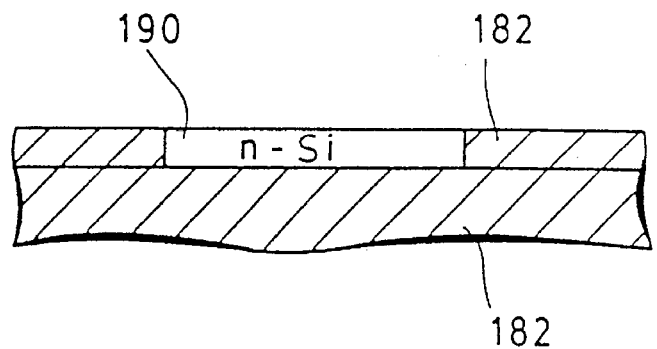
FIG. 9(*a*) through FIG. 9(*h*) illustrate a method of manufacturing an SOI bipolar transistor as a third embodiment according to the present invention and a cross sectional structure thereof.

As shown in FIG. 9(a), a thin film layer made of single crystal silicon was formed on an insulating substrate (for example, silicon oxide substrate) as an insulating portion 182, to form a semiconductor portion 190. N-impurity was introduced into the thin film layer semiconductor portion 190. For forming the above-mentioned constitution, the existent wafer bonding technique and selective oxidation technique may be used.

Figure 9B:
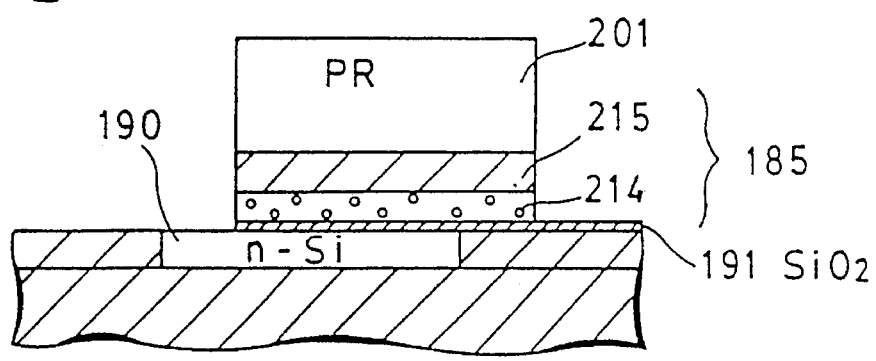

Then, as shown in FIG. 9(b), a laminate (laminate film) 185 comprising a thin oxide film 191, $P^+$ poly Si as a first conductor 214 and a silicon oxide film as an insulator 215 is formed by means of CVD.

Subsequently, the laminate structure 185 comprising the thin oxide film 191, the $P^+$ poly Si and the silicon oxide film is fabricated by using a protective film 201 such made of a photoresist. In this case, one end of the laminate structure 185 is formed on the semiconductor portion 190 of the substrate, while the other end thereof is formed on the insulating portion 182 of the substrate.

Figure 9C:
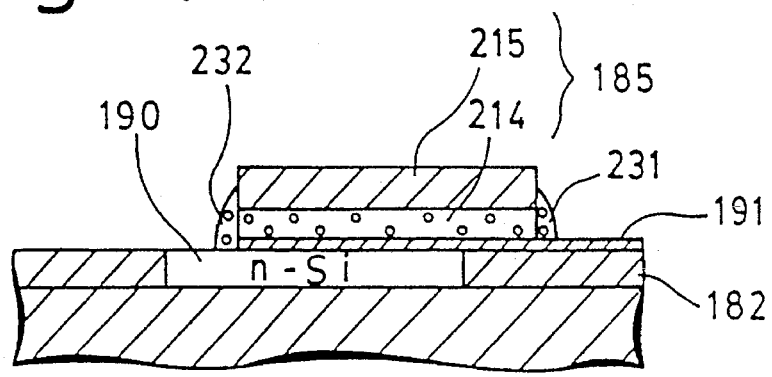

Then, as shown in FIG. 9(c), side walls 231, 232 of a second conductor are formed with poly Si on the side walls of the laminate structure 185. The side walls functions as a base contact.

In this case, since one end of the laminate structure 185 is formed on the substrate insulating portion 182 in the above-mentioned step, the side wall 231 disposed above this portion is not connected with the single crystal silicon thin film semiconductor portion 190. Accordingly, the side walls that function as the base contact can be connected with the single crystal silicon thin film layer semiconductor portion 190 only at one end of the side wall of the laminate structure 185 (only by the side wall 232 on the left side in the figure).

Figure 9D:
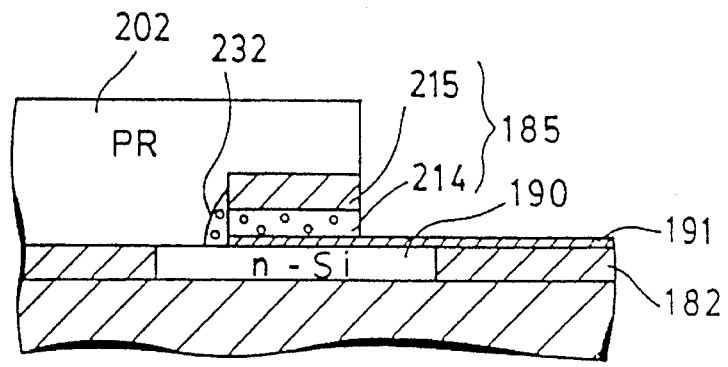

Then, as shown in FIG. 9(d), a portion of the laminate structure 185 and the poly Si side wall 232 on the substrate semiconductor portion 190 are covered with a protection film 202 such as a resist, and the exposed portion is removed. Thus, a structure in which the poly Si side wall 232 is left so as to be in contact only with a portion of the side wall of the laminate structure 285 and connected with the substrate semiconductor portion 190 is formed.

Figure 9E:
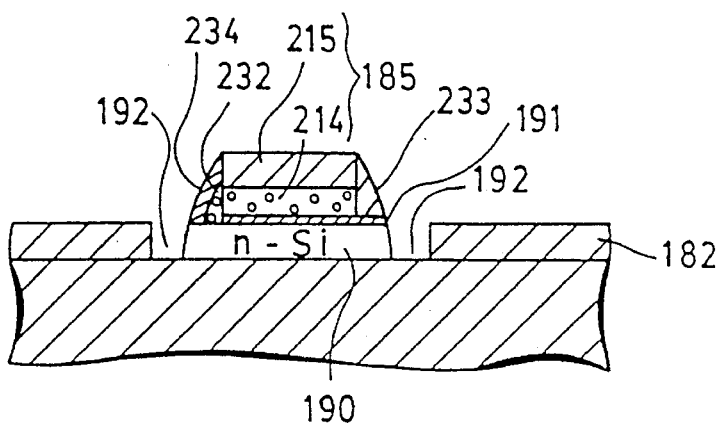

Then, as shown in FIG. 9(e), insulator side walls 233, 234 are formed with a silicon oxide film on the side walls of the laminate structure 185 by chemical vapor phase deposition and anisotropic etching subsequent thereto. The side walls function as an isolation film from a base contact and an emitter contact to be formed later.

Subsequently, the exposed single crystal silicon thin film layer semiconductor portion 190 is removed by etching as far as the underlying substrate insulating portion 182 by using the side walls 233, 234 of the silicon oxide film as a mask. Recesses formed upon removal by etching are shown by references 192.

Figure 9F:
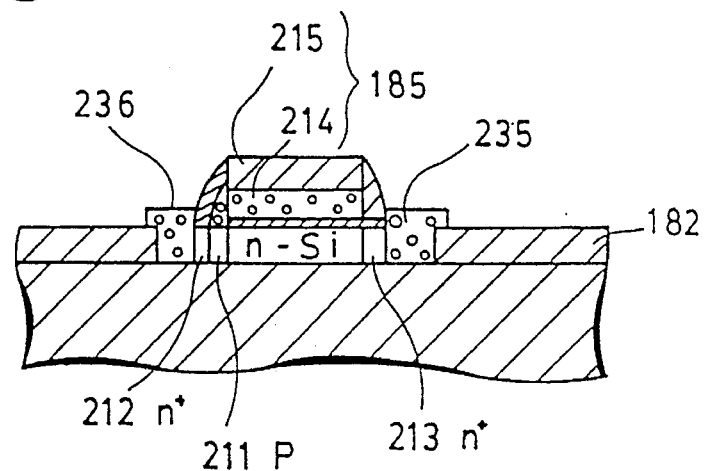

Then, as shown in FIG. 9(f), poly Si 235, 236 is buried as a third conductor in the recesses 192 of the single crystal silicon thin layer semiconductor portion 190 formed in the above-mentioned step by chemical phase vapor deposition. In this step, the buried poly Si is in an overhand form to the recess 192.

Then, after covering the collector side with a resist, $p^+$ ion implantation is applied over the entire surface. Subsequently, a base 132 as a diffusion layer 211 is formed along a direction in parallel with the surface layer of the single crystal silicon thin film layer semiconductor portion 190 (horizontal direction in the figure) by annealing using a third conductor 236 of the poly Si 127, 129 as a diffusion source.

By the method as described above, the base can be formed from a diffusion source at a substantially constant concentration in the direction of the depth of the single crystal silicon thin film layer semiconductor portion 190 (vertical direction in the figure), so that unevenness of the impurity concentration in the direction of the thickness of the substrate can be overcome.

Further, the impurity diffusion layer is formed by self-alignment with a base contact electrode (side wall 232) formed in the above-mentioned step.

Then, after implanting $N^+$ ions over the entire surface and applying annealing, impurity diffusion regions 212, 213 each at a high concentration are formed for forming emitter and collector contacts using the third conductor 235, 236 of poly Si as the diffusion source. Also in the diffusion region 212 as the emitter, unevenness of the impurity concentration in the direction of the depth of the substrate can be overcome like that in the case of the base as described previously.

Figure 9G:
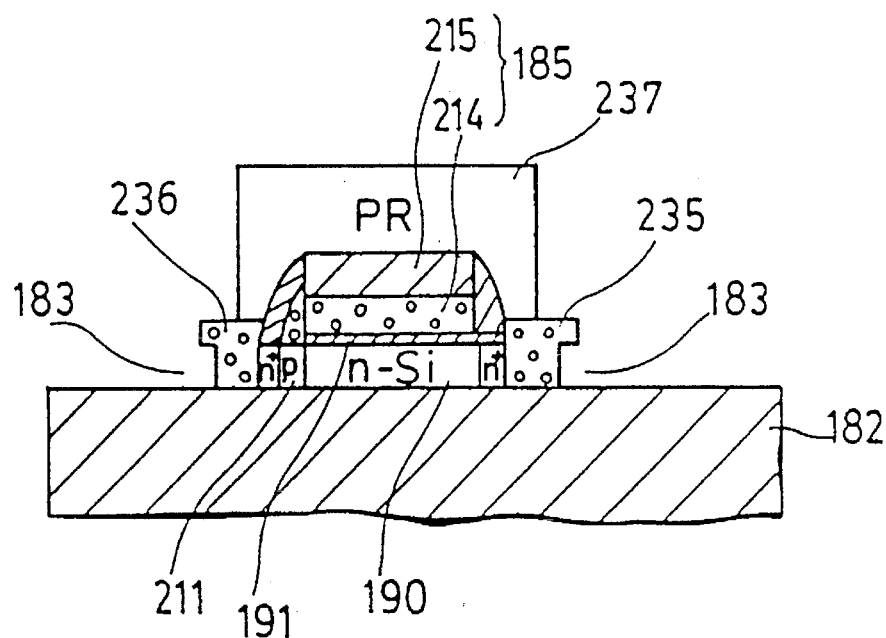

Then, as shown in FIG. 9(g), the silicon oxide film near the poly Si is removed by hydrofluoric acid using the poly Si (third conductor) 235, 236 as a mask. In this case, the insulator 215 (silicon oxide film) of the laminate structure 185 is covered with a resist 237 for preventing the portion from being removed.

Figure 9H:
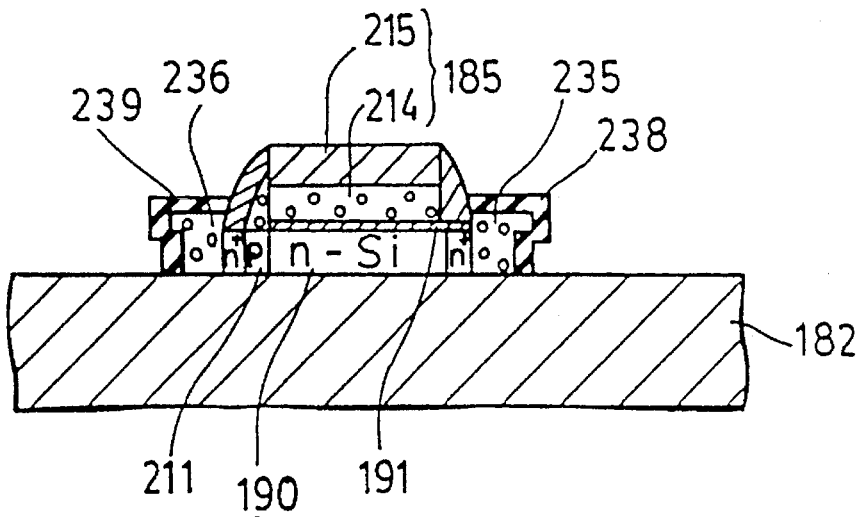

Then, as shown in FIG. 9(h), the surface of the poly Si as the third conductors 235, 236 exposed in the step shown in FIG. 9(c) is selectively silicided. For this purpose, CVD technique using $SiH_4$ and $WF_6$ may be used for instance. The silicided portion is shown by reference 238, 239.

As has been described above according to this embodiment, when a bipolar transistor is formed to the thin film SOI substrate, the base and the emitter are formed by burying the impurity diffusion source substantially at a uniform concentration in the silicon substrate in self-alignment with the base take-out electrode and through diffusion from the impurity diffusion source, so that a base region with a narrow size for the base width and with no scattering of the base width in the direction of the depth can be formed.

Further, the emitter resistance can be reduced by siliciding a portion near the third conductors 235, 236 as the impurity diffusion source buried in the silicon substrate in self-alignment.

According to the present invention, it is possible to provide a semiconductor device (particularly, a lateral bipolar transistor) while enabling to form a diffusion region (base region) with a narrow size for the diffusion region such as a base width and with no scattering in the width of the diffusion region such as a base in the direction of the depth and, in addition, reducing the resistance (emitter resistance), by burying the impurity diffusion source substantially at a uniform concentration in a semiconductor portion and forming the diffusion region through diffusion from the impurity diffusion source.

A fourth embodiment of the present invention will be described.

FIGS. 10(a) to 10(f) show a fourth embodiment according to the present invention, which is a cross sectional view in a manufacturing step of a bipolar transistor of an SOI structure.

Figure 10A:
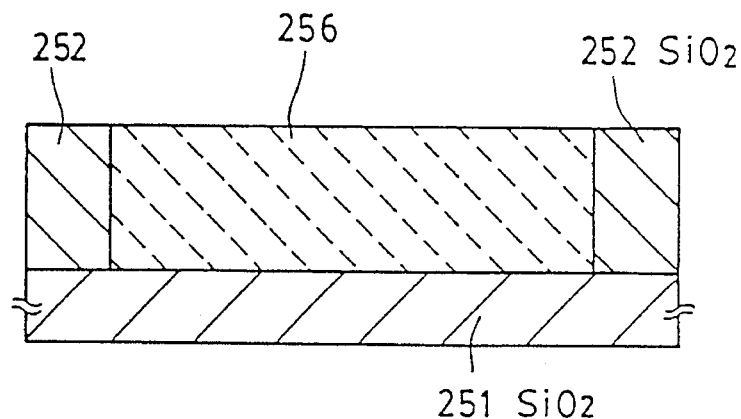
FIG. 10(*a*) through FIG. 10(*f*) illustrate a method of manufacturing an SOI bipolar transistor as a fourth embodiment according to the present invention and a cross sectional structure thereof.

As shown in FIG. 10(a), an N-substrate which is buried with $SiO_2$ 252 and flattened (N-diffusion layer) 256 and an entirely oxidized substrate ($SiO_2$ 251) are bonded and the surface is polished.

Figure 10B:
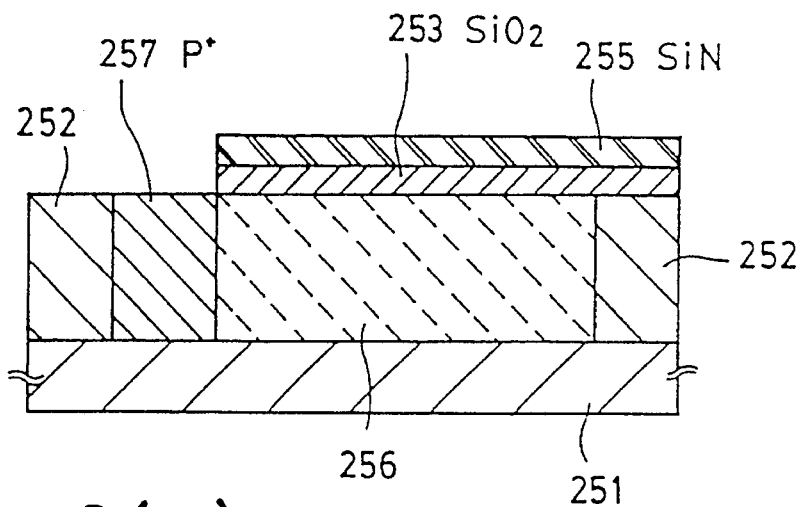

Then, as shown in FIG. 10(b) after forming $SiO_2$ to a thickness of 100 nm and SiN to a thickness of 100 nm successively, they are patterned to form $SiO_3$ 253 and SiN 255. Then, boron is ion implanted at an energy of 60 KeV and at a concentration of $7 \times 10^{13}/cm^2$ into the N-diffusion layer 3, to form a $P^+$ diffusion layer 4.

Figure 10C:
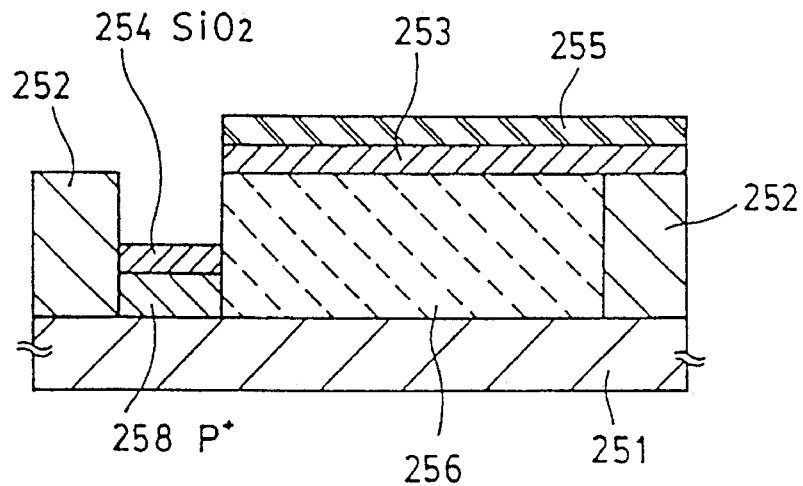

Then, as shown in FIG. 10(c), silicon of the N-substrate is removed by using SiN 255 and $SiO_2$ 252 as a mask, to form a $P^+$ diffusion layer 258 and then the surface of the $P^+$ diffusion layer 258 is selectively oxidized to form $SiO_2$ 254.

Figure 10D:
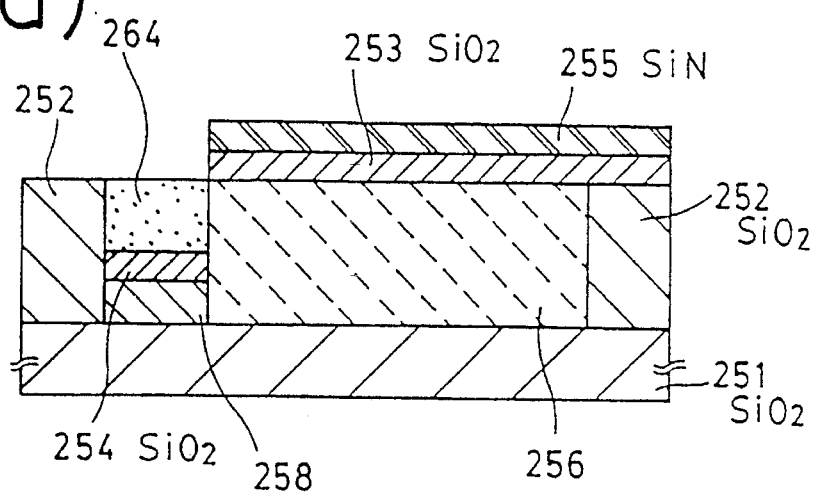

Then, as shown in FIG. 10(d), after forming poly Si over the entire surface of the N-substrate by vacuum CVD, poly Si is removed while leaving poly Si 264 in a groove.

Figure 10E:
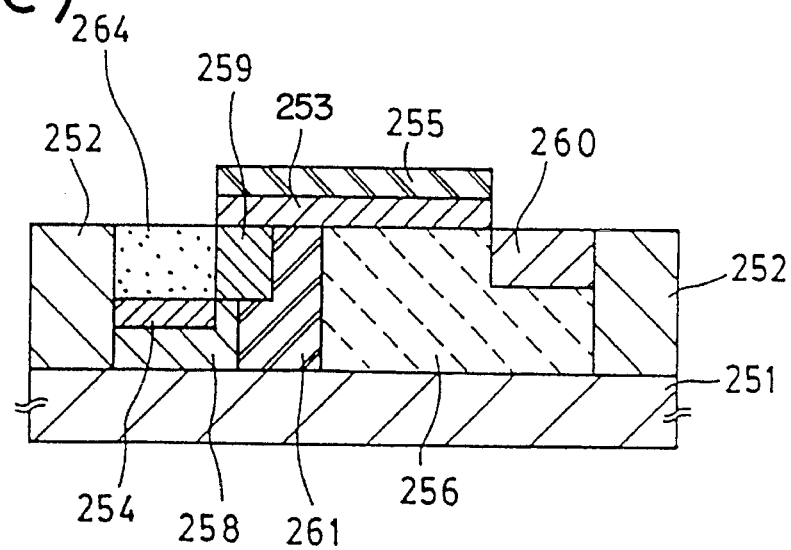

Then, as shown in FIG. 10(e), boron is ion implanted at 50 KeV and at a concentration of $1 \times 10^{14} - 3 \times 10^{14}/cm^2$ and then a heat treatment is applied at a temperature of 800° C. for 30 min. Then, after anisotropically etching SiN 255/$SiO_2$ 259 on a collector take-out region, arsenic is ion implanted over the entire surface of the N-substrate at an energy of 60 KeV and at a concentration of $1 \times 10^{16} - 3 \times 10^{16}/cm^2$, then a heat treatment is applied at 800° C. for 30 min and, further, a heat treatment is applied at 1000°–1100° C. for 10 sec. Then, a $N^+$ diffusion layers 259, 260 and a P diffusion layer 261 are formed by lateral diffusion by heating.

Figure 10F:
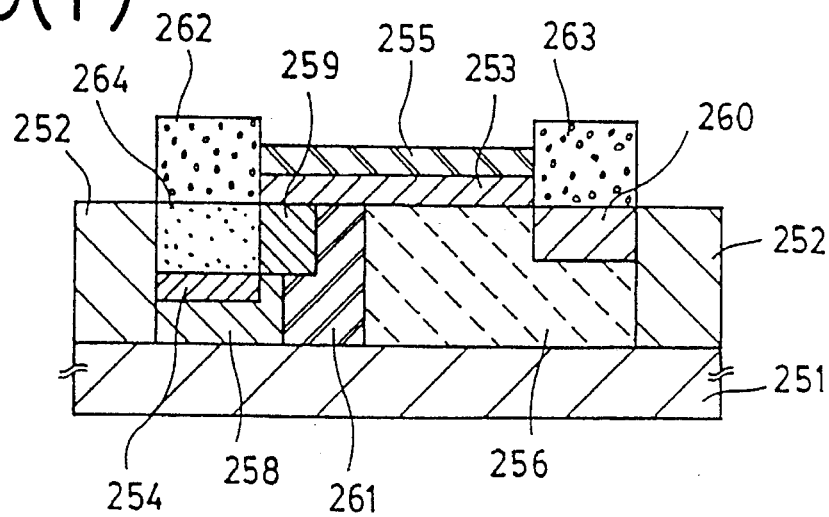

Then, as shown in FIG. 10(f), after vapor depositing aluminum over the entire surface of the N substrate, patterning is applied to form an emitter electrode 262 and a collector electrode 263.

Thus, a lateral bipolar transistor of an SOI structure in which the emitter take-out region 264, the emitter region 259, the base region 261, the collector region 256 and the collector take-out region 260 are arranged laterally, and the base take-out region 258 is constituted by way of the emitter take-out region 264 and $SiO_2$ 254 is formed.

Figure 11:
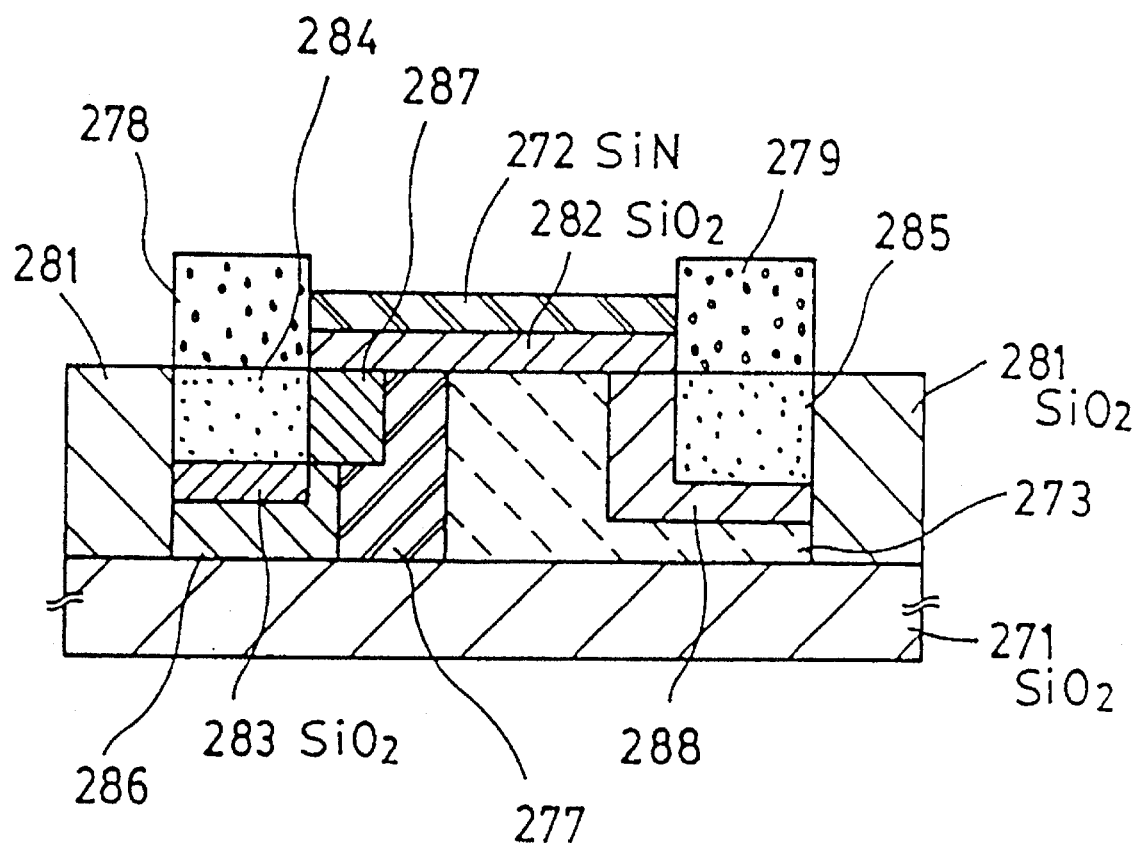
FIG. 11 illustrates a method of manufacturing an SOI bipolar transistor as a fifth embodiment according to the present invention and a cross sectional structure thereof.

FIG. 11 shows a fourth embodiment as a cross sectional view of a bipolar transistor of an SOI structure.

As shown in FIG. 11, a bipolar transistor shown in this embodiment is a lateral bipolar transistor in which an emitter take-out region 284 formed with poly Si, an emitter region 287, a base region 277, a collector region 273, a first collector take-out region 288 and a second collector take-out region 285 formed with poly Si are arranged laterally and an emitter take-out region 284 and a base take-out region 286 are formed by way of $SiO_2$ 283.

The bipolar transistor shown in FIG. 11 is formed by the same method as shown in FIG. 10(*a*), by bonding an N-substrate buried with $SiO_2$ 1*a* and flattened and an entirely oxidized ($SiO_2$ 1) substrate together and polishing the side of the surface and then forming $SiO_2$ 1*b* to a thickness of 100 nm and SiN 2 to a thickness of 100 nm in the same manner as the method shown in FIG. 10(*b*). Then, the boron is implanted at an energy of 60 KeV and at a concentration of $7\times10^{13}/cm^2$.

Figure 12A:
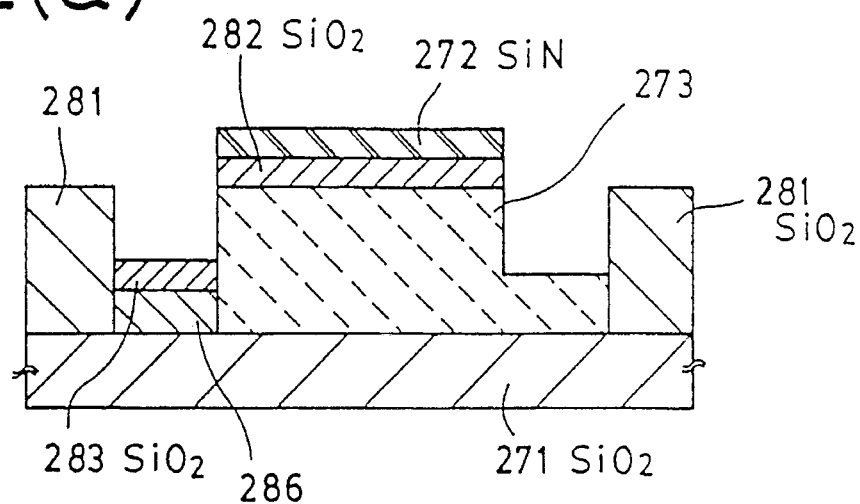
FIG. 12(*a*) through FIG. 12(*c*) illustrate a method of manufacturing an SOI bipolar transistor as a sixth embodiment according to the present invention and a cross sectional structure thereof.
Figure 12B:
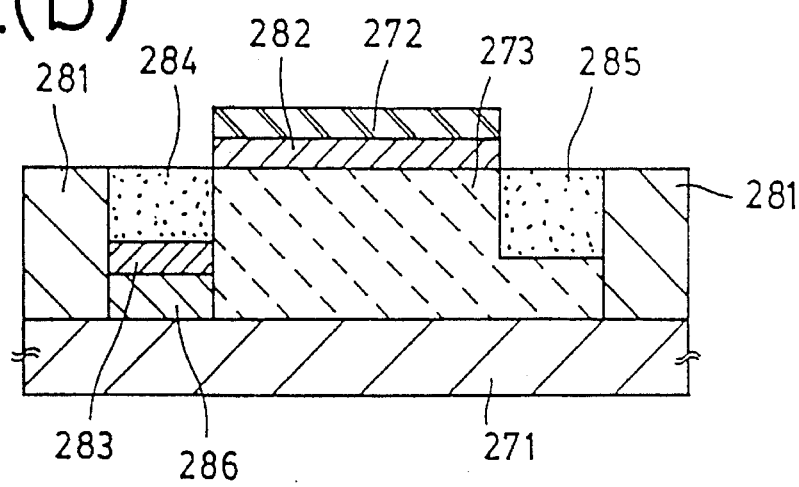
Figure 12C:
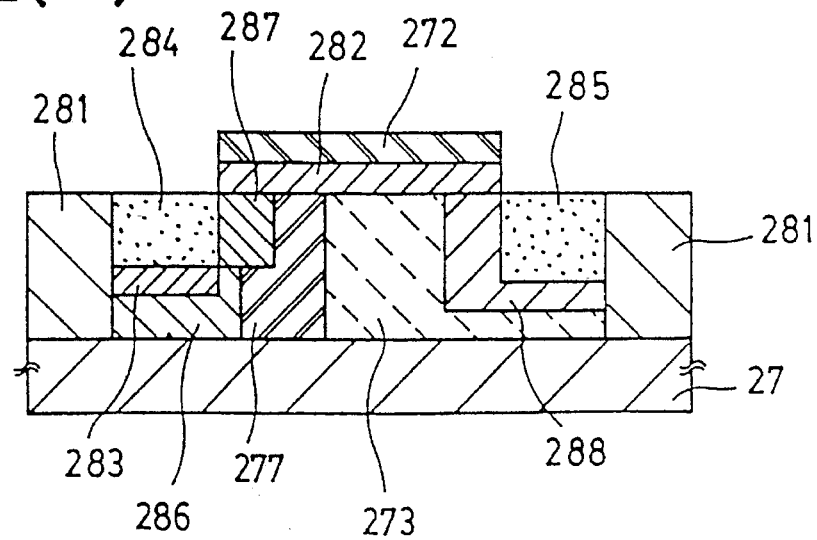

Then, after removing SiN 2/$SiO_2$ 1*b* on the collector take-out region shown in FIG. 10(*b*) by anisotropic etching, silicon in the N substrate is removed from the emitter take-out region and the collector take-out region as shown in FIG. 12(*a*). Then, after selectively oxidizing the surface of the emitter take-out region as 283, poly Si is formed to the entire surface of the N-substrate by vacuum CVD and, poly Si was removed while leaving the emitter take-out region 284 and the collector take-out region 285 as shown in FIG. 12(*b*).

Then, after forming a resist pattern to the collector take-out region, boron is implanted over the entire surface of the N-substrate at an energy of 50 KeV and at a concentration of $1\times10^{14}-3\times10^{14}/cm^2$ and then heat treatment is applied at 800° C. for 30 min. Then, after removing the resist pattern on the collector take-out region, arsenic is ion implanted over the entire surface of the N-substrate at an energy of 60 KeV and at a concentration of $1\times10^{16}-3\times10^{16}/cm^2$. Then, heat treatment is applied at first at 800° C. for 30 min and then at 1000°–1100° C. for 10 sec. Then, as shown in FIG. 12(*c*), respectively regions are formed: a P diffusion layer 277 as a base region, an $N^+$ diffusion layer 287 as an emitter region, an N-diffusion-layer 273 as a collector region and an $N^+$ diffusion layer 288 as a first collector take-out region.

Figure 1A:
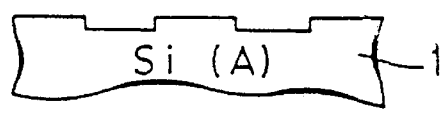
FIG. 1(*a*) through FIG. 1(*g*) illustrate a method of manufacturing a bonded SOI.
Figure 1B:
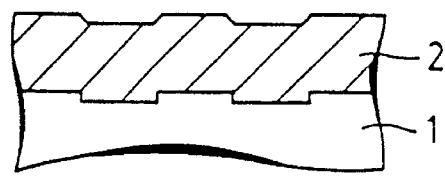
Figure 1C:
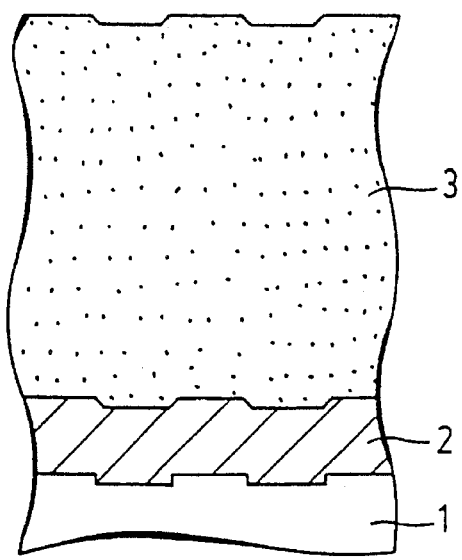
Figure 1D:
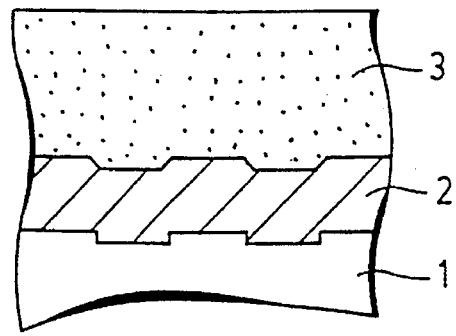
Figure 1E:
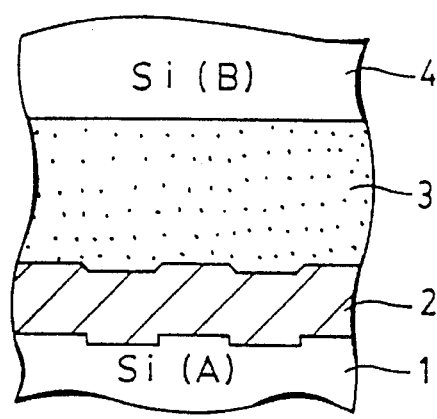
Figure 1F:
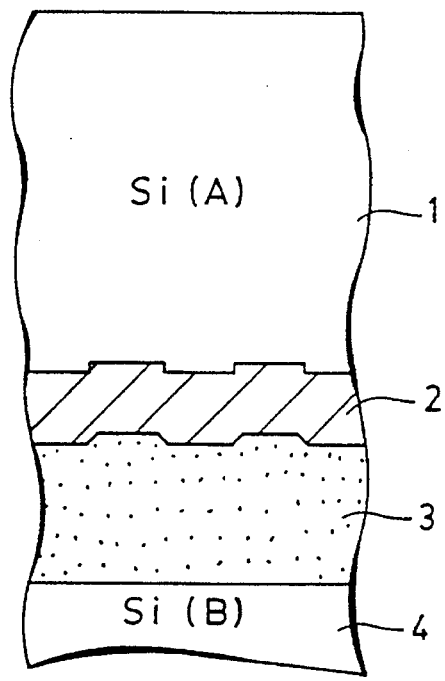
Figure 1G:
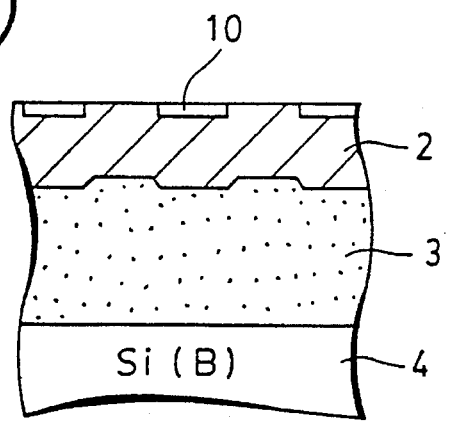
Figure 2A:
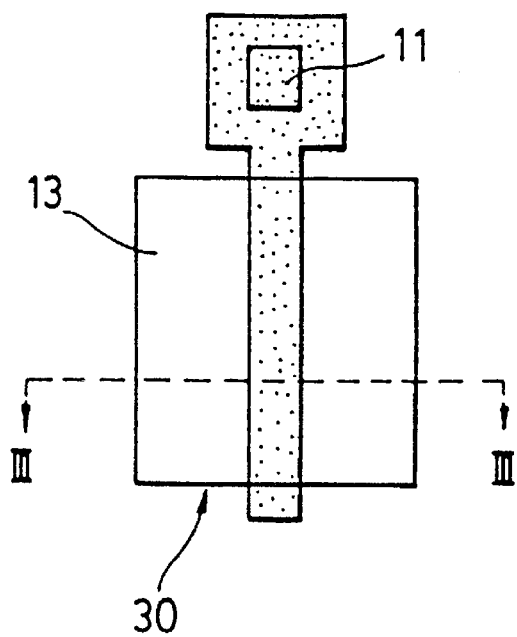
FIG. 2(*a*) and FIG. 2(*b*) illustrate a structure of an SOI bipolar transistor.
Figure 2B:
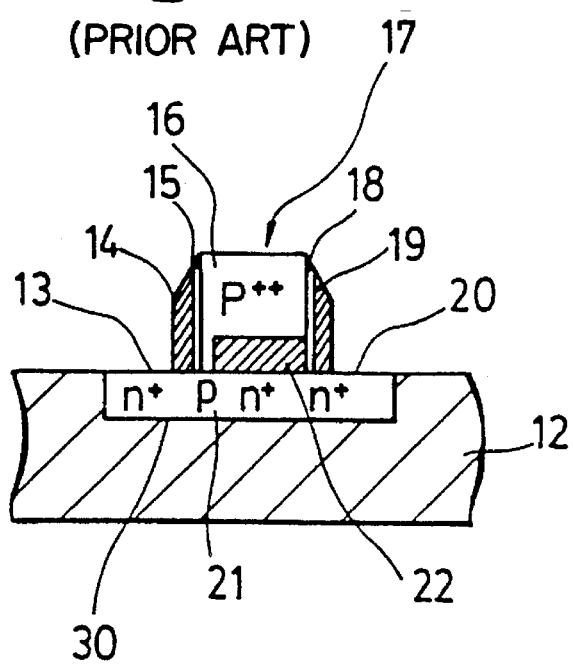
Figure 3A:
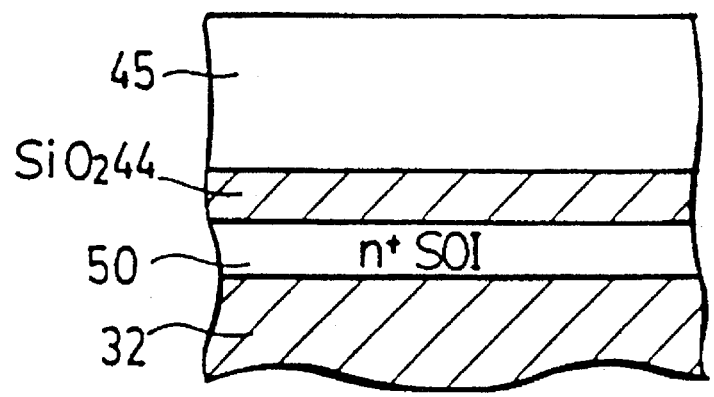
FIG. 3(*a*) through FIG. 3(*d*) illustrate a method of manufacturing another SOI bipolar transistor according to the prior art.
Figure 3B:
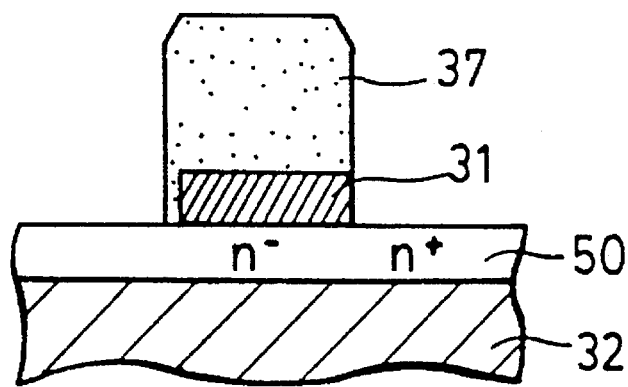
Figure 3C:
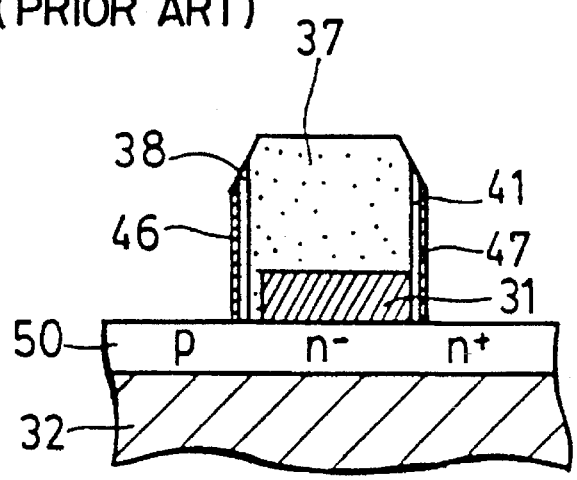
Figure 3D:
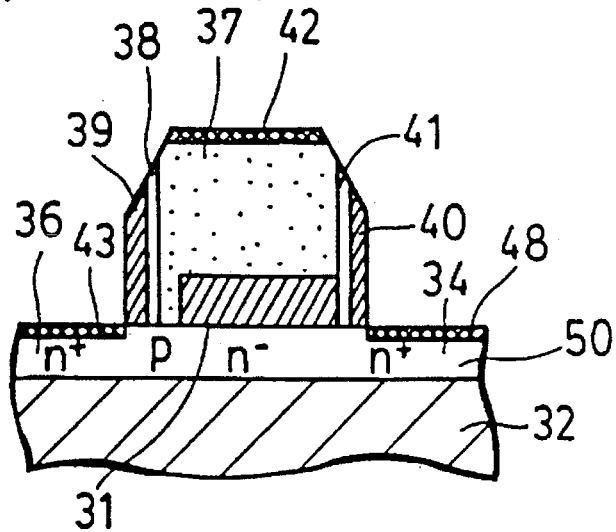
Figure 4:
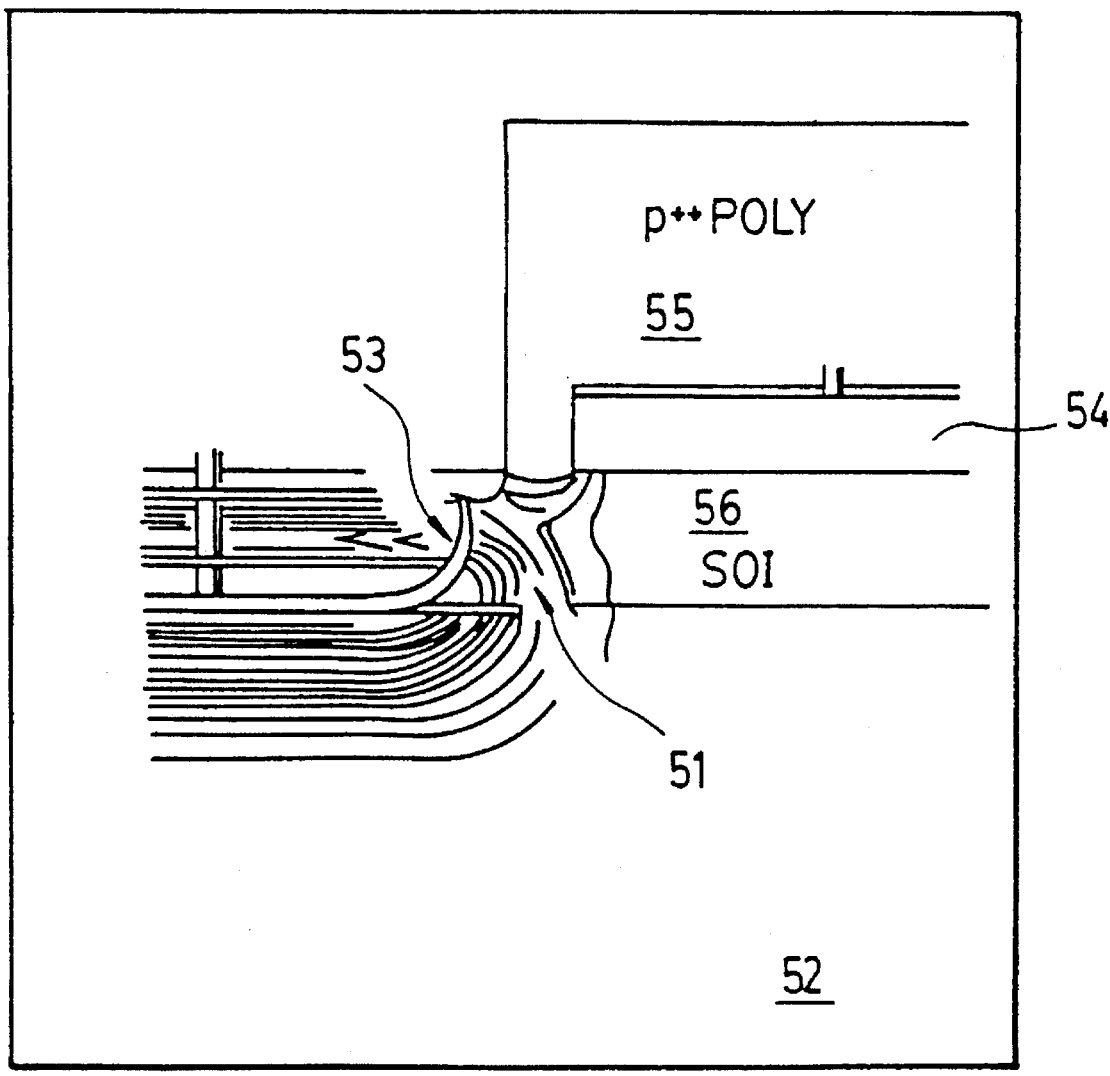
FIG. 4 illustrates a portion near the emitter and the base of an SOI bipolar transistor according to the prior art.
Figure 5:
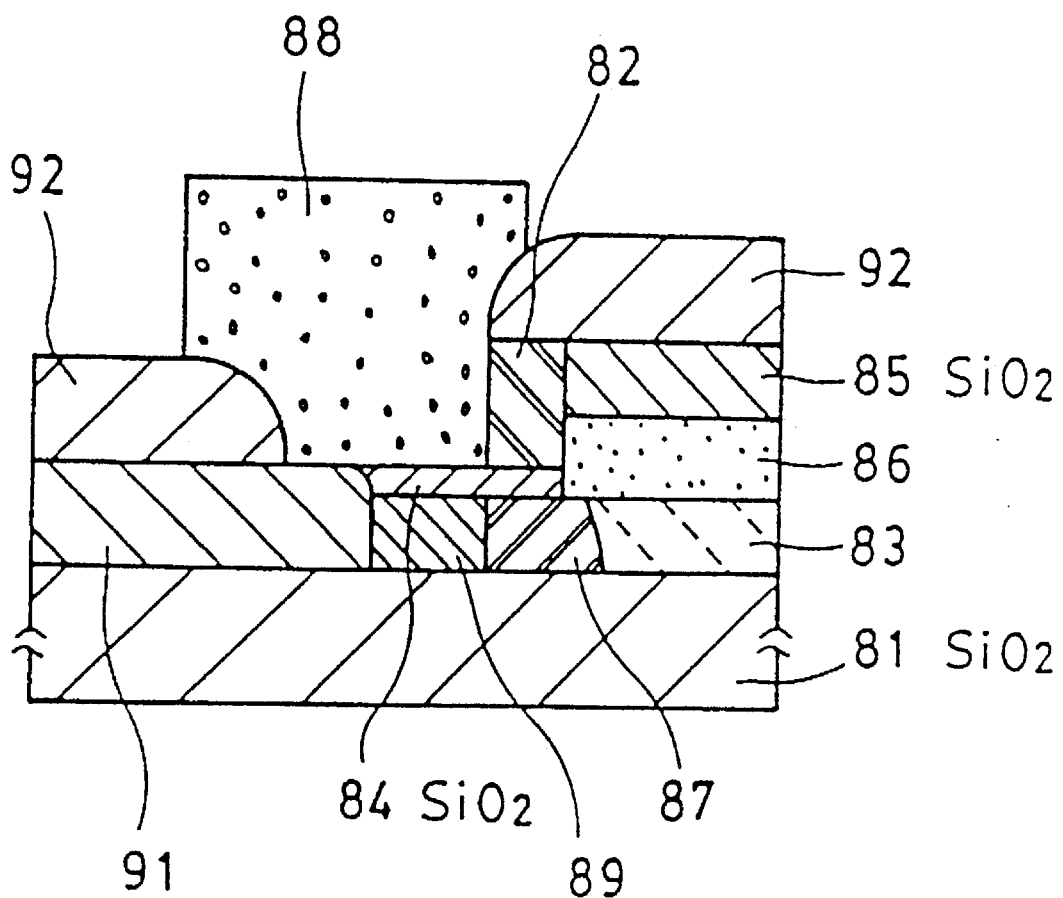
FIG. 5 illustrates a cross sectional structure of an SOI bipolar transistor according to the prior art.
Figure 6A:
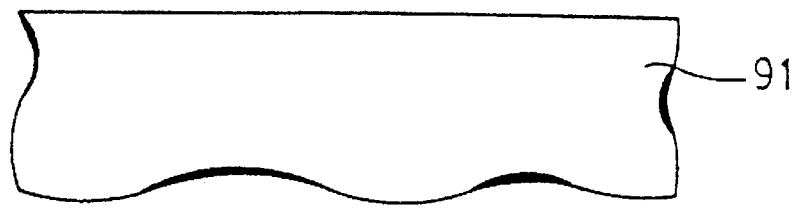
FIG. 6(*a*) through FIG. 6(*c*) illustrate a prior art method of forming an SOI substrate for manufacturing a SOI transistor.
Figure 6B:
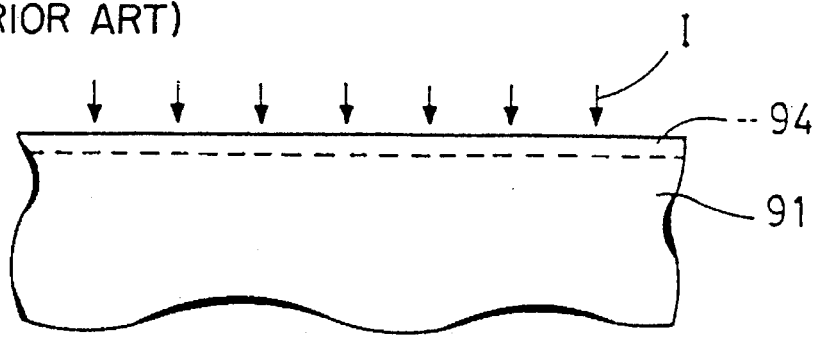
Figure 6C:
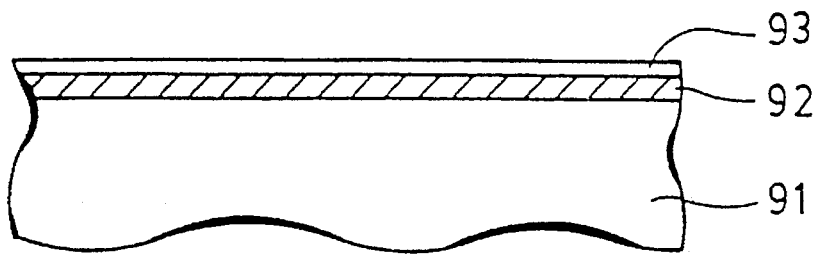

Then, after vapor depositing aluminum over the entire surface of the N-substrate as shown in FIG. 11, patterning is applied to form an emitter electrode 278 and a collector electrode 279. Thus, the bipolar transistor shown in FIG. 2 is obtained.

Figure 13A:
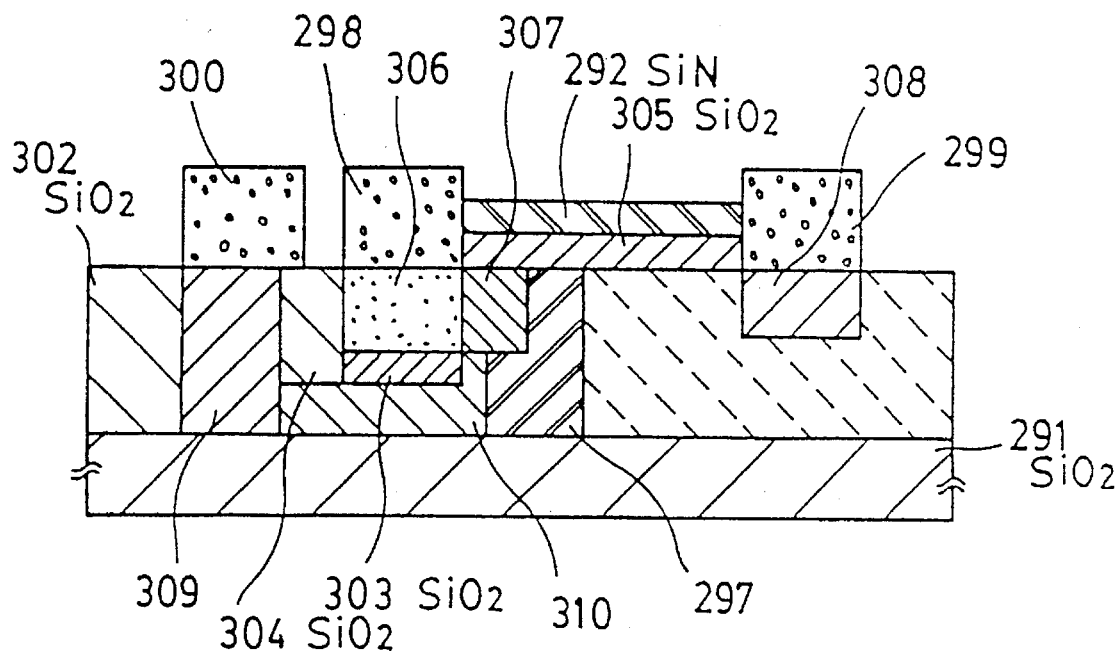
FIG. 13(*a*) through FIG. 13(*b*) illustrate a method of manufacturing an SOI bipolar transistor as a seventh embodiment according to the present invention and a cross sectional structure thereof.
Figure 13B:
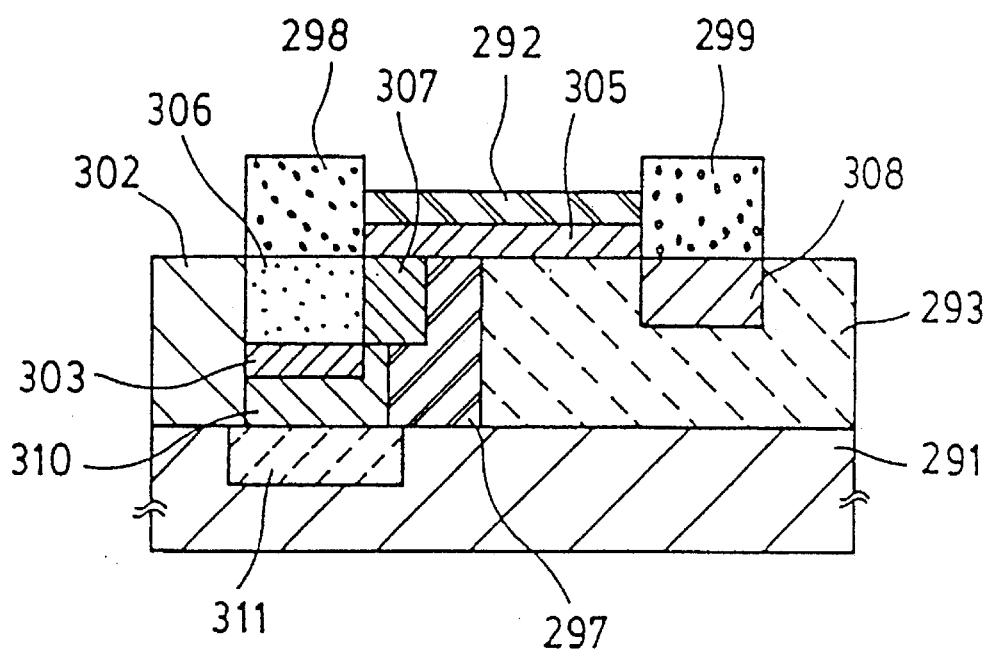

FIGS. 13(*a*) to 13(*d*) show a seventh embodiment as a cross sectional view illustrating a base electrode.

In FIG. 13(*a*), an N-substrate buried with $SiO_2$ 302 is formed on an entirely oxidized substrate ($SiO_2$ 291), and a base electrode 300 is formed on the N-substrate. A base electrode 306 and a base region 297 are connected by way of a base take-out regions 309 and 310 formed with a $P^+$ diffusion layer. Further, the base take-out regions 310 and 309 and an emitter take-out regions 306 are formed by way of $SiO_2$ 303 and 302, the emitter take-out region 306, the emitter region 307, the base region 297, the collector region 293 and the collector take-out region 307 are arranged laterally, and the emitter electrode 298 and the collector electrode 9 are formed by way of SiN 297/$SiO_2$ 305.

Further, the base take-out region 309 below the base electrode 300 can also be formed with boron-implanted poly Si. An N-substrate buried with $SiO_2$ 302 and flattened is bonded with an entirely oxidized ($SiO_2$ 291) substrate in which the base electrode 311 is formed by burying tungsten poly side or boron-implanted poly Si.

The base electrode 311 is connected with a base region 297 by way of a base take-out region 310 to form a lateral bipolar transistor of a reduced base resistance.

According to the present invention, since the emitter take-out region and the base take-out region are formed by way of the insulating layer, the diffusing direction of the impurity injected into the emitter take-out region and the base take-out region can be controlled only in the lateral direction, so that a base current can be caused to flow in the base take-out region along the lateral direction or the direction of the depth of the base if a shorter path to reduce the base resistance.

Further, according to the present invention, since the emitter take-out region is formed with poly Si in the silicon substrate, the insulating layer is formed below the emitter take-out region and the base take-out region is formed below the insulating layer, the impurity injected into the emitter take-out region and the base take-out region can be controlled in the lateral direction and the emitter region and the base region can be formed with the second impurity and the first impurity respectively through diffusion. Since the diffusion has good controllability, it is possible to form a lateral bipolar transistor which is stable and has a base width of a good controllability with a reduced base resistance in which the emitter takeout region, base region, collector region of the second impurity and the collector take-out of the second impurity are arranged laterally.

Further, according to the present invention, it is possible to form a lateral bipolar transistor in which the emitter takeout region, the insulating layer and the base take-out region are arranged vertically, while the emitter take-out region, the emitter region of the second impurity, the base region of the first impurity, the collector region of the second impurity, the first collector takeout region of the second impurity and the collector takeout region of the poly Si are arranged laterally. Since the first collector take-out region can be formed deeply in the collector region, the collector region can be reduced by so much to reduce the collector resistance.

Further, according to the present invention, when the first impurity is injected to the first predetermined region of the silicon substrate and, thereafter, silicon is removed from the first predetermined region, the base take-out region is formed with the first impurity. When the insulating layer is formed on the surface of the first predetermined region, poly Si is formed on the insulating layer then the first impurity is injected to the poly Si, and then a heat treatment is applied, the first impurity injected to the poly Si and the base take-out region is diffused laterally and can be joined because of the presence of the $SiO_2$ of the insulating layer. Then, after opening the contact hole to a second predetermined region of the silicon substrate, when a second impurity is injected to the first predetermined region and the second predetermined region followed by heat treatment, the second impurity injected into the first predetermined region is diffused laterally, to form the emitter region with the region compensated by the first impurity, the base region with the region not compensated with the first impurity and the collector take-out region by the diffusion of the second impurity injected to the second predetermined region.

Thus, it is possible to form a lateral bipolar transistor comprising the emitter take-out region, the emitter region, the base region, the collector region and the collector take-out region and having a reduced base resistance and good controllability for the base width.

Further, according to the present invention, when the silicon is removed from the second predetermined region, poly Si is formed to the second predetermined region and then injecting the second impurity to the second predetermined region followed by the heat treatment, the first collector take-out region and the second collector takeout region are formed by the diffusion of the second impurity, and the first collector take-out region can be formed deeply in the collector region.

As has been described above according to the present invention, it is possible to form a semiconductor device of a lateral bipolar transistor of a SOI structure with the good controllability for the base width and reduced base resistance and collector resistance.

Description will now be made to an eighth embodiment according to the present invention.

In this embodiment, VLSI of an SOI structure was formed by the following steps as shown in FIG. 14(a) through FIG. 14(d).

At first, a silicon substrate 1 is provided.

Figure 14A:
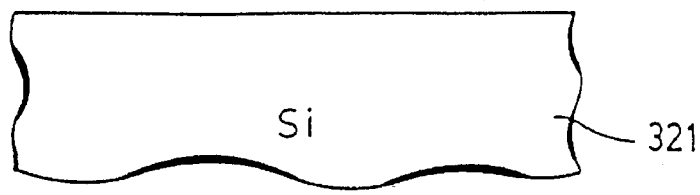
FIG. 14(*a*) through FIG. 14(*d*) illustrate a method of manufacturing an SOI bipolar transistor as a eighth embodiment according to the present invention and a cross sectional structure thereof.
Figure 14B:
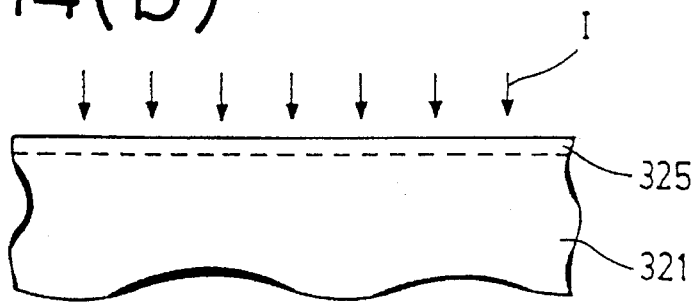
Figure 14C:
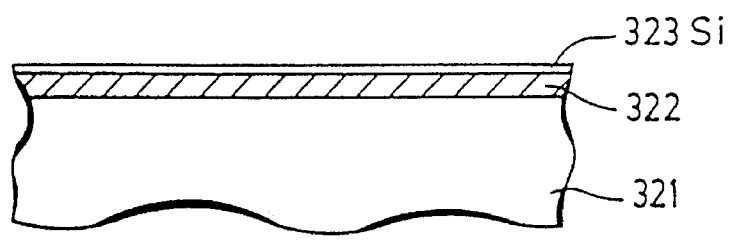
Figure 14D:
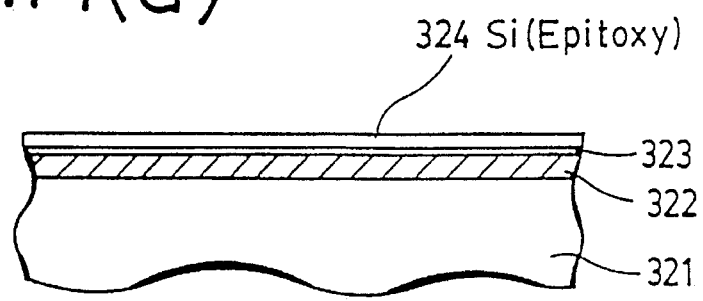
Figure 15A:
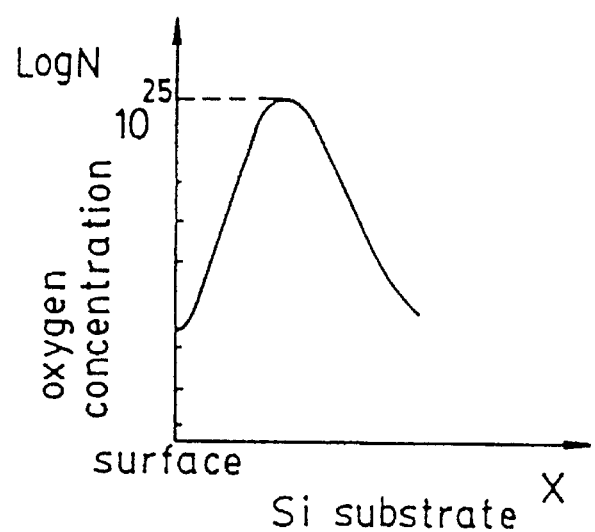
FIG. 15(*a*) and FIG. 15(*b*) illustrate a profile of an oxygen concentration from the surface to the inside of the SOI substrate shown in FIG. 14(*a*) through 14(*d*).
Figure 15B:
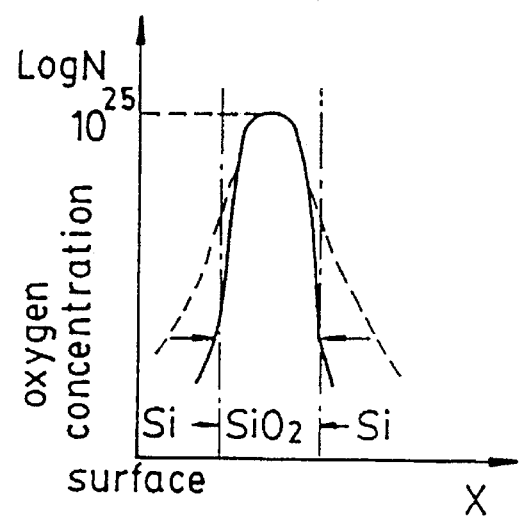

Then, oxygen is ion implanted at an accelerated energy of 300 KeV and at an order of $10^{17}/cm^2$ order (refer to FIG. 14(b). The ion implanted portion is schematically shown by a broken line portion depicted as 325. In a case of selectively forming an SOI layer, patterning may be applied before oxygen ion implantation.

Then, annealing at a high temperature is applied for a short period of time by irradiating an excimer laser beam at a power of about 1000 to 2000 $mJ/cm_2$. This sharpens dull side slopes in an oxygen distribution by depositing oxygen or out diffusing it from the surface, restoring defects caused by ion implantation at high concentration and forming an oxide layer 322 and a crystal silicon layer 323 on a silicon substrate 321 (FIG. 14(c)).

Further, if required, a silicon epitaxial layer 324 is additionally formed by epitaxy. For epitaxy, epitaxy under a reduced pressure and low temperature is preferably used, for reducing thermal hysteresis. The epitaxy at a reduced pressure can be applied under the condition, for example, at 560° C., 70 sccm of $Si_2H_6$, at $2\times10^{-5}$ Torr and at a rate of 7 nm/min.

Subsequently, a device is prepared into the SOI layer. In a case of preparing a further multi-layered structure, steps shown in FIGS. 14(a) through 14(d) are repeated.

In the method of manufacturing the SOI substrate of this embodiment, since it is possible to suppress occurrence of defects such as slip lines and restore defects caused by oxygen ion implantation at high dose and, further, the lower layer is not annealed simultaneously by annealing for the upper layer and an optimal annealing can be applied to each of the crystalline silicon layer and, upon manufacturing a multi-layered SOI substrate, a semiconductor device of high performance can be manufactured.

According to the present invention, it is possible to provide a method of manufacturing an SOI substrate causing less defects such as slip lines, capable of restoring defects that are possibly caused upon ion implantation of oxygen at high concentration and, further, capable of forming a multi-layered SOI substrate.

In the method of manufacturing an SOI substrate according to the present invention, since oxygen ion implantation is applied to a silicon portion and, subsequently, annealing is applied by the irradiation of the excimer laser beam, dull slopes in the oxygen distribution are sharpened by depositing oxygen or out diffusing it from the surface (refer to FIGS. 16(a) and 16(b)) and, further, defects caused by ion implantation at high concentration are restored, to form a crystalline silicon layer and an oxide layer.

In the method of manufacturing an SOI substrate according to the present invention, since the region to be heated by the irradiation of the excimer laser beam used for annealing is as thin as from several tens to several hundreds nm, defects such as slip lines are less caused. Further, since the temperature of the silicon surface is instantaneously elevated to about 1400° C. in the annealing by the irradiation of the excimer laser beam, defects caused by ion implantation of oxygen at high concentration can also be restored. Further, the thickness of the silicon crystalline layer can be increased by additionally providing silicon epitaxy. Furthermore, since the excimer laser beam is greatly absorbed in the silicon layer and absorbed from several tens to several hundreds nm from the surface, a multi-layered SOI substrate can also be formed by repeating the above-mentioned steps.

What is claimed is:

1. A method of manufacturing a semiconductor device which comprises:

a step of providing an insulating substrate and a semiconductor portion;

a step of forming on said substrate a laminate structure comprising a first conductor and a first insulator, a step of forming a first side wall comprising a second conductor in contact with a side portion of said laminate structure, a step of forming a second side wall comprising a second insulator in contact with said first side wall, a step of removing at least one of a portion of said insulating substrate and said semiconductor portion using the side portion of said laminate structure and said second insulator as a mask, a step of burying a third conductor into a recess formed by said step of removing, and a step of forming a diffusion region using the third conductor as a diffusion source.

2. A method of manufacturing a semiconductor device as defined in claim 1, wherein the first and the second conductors comprise poly Si or a laminate structure of poly Si and metal.

3. A method of manufacturing a semiconductor device as defined in claim 1 or 2, wherein the third conductor comprises poly Si.

4. A method of manufacturing a semiconductor device which comprises:

a step of removing a portion of a semiconductor portion situated in an insulating portion, a step of burying a conductor to the portion removed from the semiconductor portion, a step of forming a diffusion region using said conductor as a diffusion source, a step of removing a portion of said insulating portion using the conductor as a mask, thereby exposing at least a portion of said conductor buried in said portion to be removed from the semiconductor portion, and a step of selectively siliciding said exposed portion of said conductor.

5. A method of manufacturing a semiconductor device as defined in claim 4, wherein the semiconductor portion comprises an SOI structure.

6. A method of manufacturing a semiconductor device as defined in claim 4 or 5, wherein the semiconductor device is a bipolar transistor and the step of forming the diffusion region using the conductor as a diffusion source is a step of forming at least one of an emitter and a base.

7. A method of manufacturing a semiconductor device as defined in any one of claim 4 or 5, wherein the conductor comprises poly Si.

8. A method of manufacturing a semiconductor device which comprises:
- a step of forming a laminate structure comprising a first conductor and a first insulator over a substrate in which a semiconductor portion is formed in an insulating portion,
- a step of forming a first side wall comprising a second conductor in contact with a side portion of said laminate structure,
- a step of forming a second side wall comprising a second insulator in contact with said first side wall,
- a step of removing a portion of said semiconductor portion using the side portion of said laminate structure and said second side wall as a mask,
- a step of burying a third conductor into the removed portion of the semiconductor portion,
- a step of forming a diffusion region using said third conductor as a diffusion source,
- a step of removing a portion of said insulating portion using said third conductor as a mask thereby providing an exposed portion of the third conductor buried in said removed portion of the semiconductor portion, and
- a step of selectively siliciding the exposed portion of said third conductor.

9. A method of manufacturing a semiconductor device as defined in claim 8, wherein the semiconductor portion has an SOI structure.

10. A method of manufacturing a semiconductor device as defined in claim 8 or 9, wherein the semiconductor device is a bipolar transistor and a step of forming the diffusion region using said third conductor as a diffusion source is a step of forming at least one of an emitter and a base.

11. A method of manufacturing a semiconductor device as defined in any one of claim 8 or 9, wherein at least one of said first and second conductors comprises poly Si or a laminate structure of poly Si and metal.

12. A method of manufacturing a semiconductor device as defined in any of claim 8 or 9, wherein the third conductor comprises poly Si.

* * * * *